(12) United States Patent
Butterfield et al.

(10) Patent No.: US 9,531,409 B2
(45) Date of Patent: Dec. 27, 2016

(54) SWITCHED CAPACITOR TRANSMITTER CIRCUITS AND METHODS

(71) Applicant: QUALCOMM Incorporated, San Diego, CA (US)

(72) Inventors: Daniel Keyes Butterfield, Encinitas, CA (US); Peiyuan Wang, San Diego, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/680,988

(22) Filed: Apr. 7, 2015

(65) Prior Publication Data

US 2015/0381215 A1    Dec. 31, 2015

Related U.S. Application Data

(60) Provisional application No. 62/017,060, filed on Jun. 25, 2014, provisional application No. 62/063,863, filed on Oct. 14, 2014.

(51) Int. Cl.
*H04L 27/00* (2006.01)
*H04B 1/04* (2006.01)
(Continued)

(52) U.S. Cl.
CPC .............. *H04B 1/0458* (2013.01); *H03F 1/02* (2013.01); *H03F 1/0205* (2013.01); *H03F 1/32* (2013.01); *H03F 3/005* (2013.01); *H03F 3/19* (2013.01); *H03F 3/21* (2013.01); *H03F 3/211* (2013.01); *H03F 3/24* (2013.01); *H03F 3/45179* (2013.01);
(Continued)

(58) Field of Classification Search
CPC ............ H04B 1/0458; H04B 2001/045; H04B 1/0475; H03F 2200/451; H03F 1/0205; H03F 3/19; H03F 3/21; H03F 1/32; H03F 3/45179; H03F 3/24; H03F 3/211; H03F 2200/541; H03F 2200/537; H03F 2200/516; H03F 2200/336; H03F 2200/331; H03M 1/066
See application file for complete search history.

(56) References Cited

U.S. PATENT DOCUMENTS 5,684,482 A    11/1997  Galton
5,892,835 A    4/1999   Kim
(Continued)

FOREIGN PATENT DOCUMENTS

EP    2736167 A1    5/2014

OTHER PUBLICATIONS

Allstot D.J., "CMOS Switched-Capacitor Circuits: Recent Advances in Bio-Medical and RF Applications," Aug. 17, 2011, Slide 1 to 57.
(Continued)

*Primary Examiner* — Syed Haider
(74) *Attorney, Agent, or Firm* — Haynes and Boone, LLP

(57) ABSTRACT

The present disclosure includes switched capacitor transmitter circuits and methods. In one embodiment, the present disclosure includes a plurality of switched capacitor transmitter circuits coupled to inputs of an inductive network. The inductive network combines voltages from the switched capacitor transmitter circuits to produce a combined voltage on an output. In another embodiment, a digital data signal is thermometer encoded and a negative thermo-encoded signal is bit order reversed to control capacitors in a switched capacitor transmitter circuit.

18 Claims, 30 Drawing Sheets

(51) Int. Cl.

| | |
|---|---|
| *H03F 1/02* | (2006.01) |
| *H03F 1/32* | (2006.01) |
| *H03F 3/19* | (2006.01) |
| *H03F 3/21* | (2006.01) |
| *H03M 7/16* | (2006.01) |
| *H04L 27/34* | (2006.01) |
| *H04L 27/36* | (2006.01) |
| *H03F 3/00* | (2006.01) |
| *H03F 3/24* | (2006.01) |
| *H03F 3/45* | (2006.01) |
| *H03M 1/06* | (2006.01) |
| *H03M 1/66* | (2006.01) |
| *H03M 1/80* | (2006.01) |

(52) U.S. Cl.
CPC ........... *H03M 1/066* (2013.01); *H03M 1/66* (2013.01); *H03M 7/165* (2013.01); *H04B 1/0475* (2013.01); *H04L 27/3416* (2013.01); *H04L 27/36* (2013.01); *H03F 2200/331* (2013.01); *H03F 2200/336* (2013.01); *H03F 2200/451* (2013.01); *H03F 2200/516* (2013.01); *H03F 2200/537* (2013.01); *H03F 2200/541* (2013.01); *H03F 2203/21142* (2013.01); *H03F 2203/45364* (2013.01); *H03M 1/804* (2013.01); *H04B 2001/045* (2013.01)

(56) References Cited

U.S. PATENT DOCUMENTS

| | | | |
|---|---|---|---|
| 5,977,899 A | 11/1999 | Adams | |
| 6,556,158 B2 | 4/2003 | Steensgaard-Madsen | |
| 6,614,377 B1 | 9/2003 | Adams et al. | |
| 6,697,004 B1 | 2/2004 | Galton et al. | |
| 6,797,934 B2 | 9/2004 | Kramer et al. | |
| 6,816,103 B2 | 11/2004 | Jonsson et al. | |
| 6,864,818 B1 | 3/2005 | Hezar | |
| 6,903,672 B1 | 6/2005 | Maurino | |
| 6,917,321 B1 | 7/2005 | Haurie et al. | |
| 6,940,436 B2 | 9/2005 | Hezar et al. | |
| 7,009,313 B1 | 3/2006 | Parramon et al. | |
| 7,129,784 B2 | 10/2006 | Bhatti et al. | |
| 7,157,965 B1 | 1/2007 | Kim | |
| 7,199,740 B1 | 4/2007 | Ferguson, Jr. et al. | |
| 7,327,295 B1 | 2/2008 | Trotter et al. | |
| 7,330,076 B2 | 2/2008 | Komijani et al. | |
| 7,345,530 B1* | 3/2008 | Li | H03F 3/005 |
| | | | 330/51 |
| 7,414,558 B2 | 8/2008 | Rivoir et al. | |
| 7,456,773 B1 | 11/2008 | Seo et al. | |
| 7,538,705 B2 | 5/2009 | Deval et al. | |
| 7,567,195 B2 | 7/2009 | Magrath | |
| 7,663,525 B2 | 2/2010 | Tsai | |
| 7,804,434 B2 | 9/2010 | Stoutjesdijk | |
| 7,821,434 B2 | 10/2010 | Huppertz | |
| 7,961,126 B2 | 6/2011 | Deval et al. | |
| 7,969,340 B2 | 6/2011 | Lou et al. | |
| 7,973,612 B2 | 7/2011 | Raghunathan et al. | |
| 8,098,718 B2 | 1/2012 | Sienko et al. | |
| 8,314,653 B1* | 11/2012 | Granger-Jones | H03F 1/223 |
| | | | 327/552 |
| 8,340,224 B2 | 12/2012 | Norsworthy et al. | |
| 8,378,871 B1 | 2/2013 | Bapat | |
| 8,493,139 B2 | 7/2013 | Sayuk | |
| 8,692,199 B2 | 4/2014 | Huppertz | |
| 8,782,112 B2 | 7/2014 | Ling et al. | |
| 8,994,467 B2 | 3/2015 | Lee et al. | |
| 9,099,994 B2 | 8/2015 | Thomsen et al. | |
| 2005/0083106 A1* | 4/2005 | Hazucha | H02M 3/073 |
| | | | 327/337 |
| 2005/0140422 A1* | 6/2005 | Klemmer | H03F 1/30 |
| | | | 327/337 |
| 2005/0231411 A1* | 10/2005 | Wu | G06G 7/184 |
| | | | 341/150 |
| 2008/0104432 A1* | 5/2008 | Vinayak | G06F 1/26 |
| | | | 713/300 |
| 2010/0052732 A1 | 3/2010 | Tokano | |
| 2012/0144269 A1 | 6/2012 | Baker | |
| 2012/0313696 A1* | 12/2012 | Tejada | G11C 5/147 |
| | | | 327/538 |
| 2014/0049318 A1 | 2/2014 | Goswami | |
| 2014/0077876 A1* | 3/2014 | Feygin | H03G 3/004 |
| | | | 330/127 |
| 2014/0125412 A1 | 5/2014 | Dawson et al. | |
| 2014/0145787 A1* | 5/2014 | Verlinden | H03F 3/245 |
| | | | 330/124 R |
| 2014/0375386 A1 | 12/2014 | Rivoirard | |
| 2015/0085902 A1 | 3/2015 | Butterfield et al. | |
| 2015/0145571 A1 | 5/2015 | Perrott | |
| 2015/0381401 A1 | 12/2015 | Butterfield | |

OTHER PUBLICATIONS

Walling J.S., et al., "Digital Power Amplifier: A New Way to Exploit the Switched-Capacitor Circuit," IEEE Communications Magazine, Apr. 2012, vol. 50 (4), pp. 145-151.

Aoki et al., "Distributed Active transformer—A New Power-Combining and Impedance-Transformation Technique", IEEE Transactions on Microwave Theory and Techniques, vol. 50, No. 1, Jan. 2002, pp. 306-331.

Aoki et al., "Fully Integrated CMOS Power Amplifier Design using the Distributed Active-Transformer Architecture", IEEE Journal of Solid-Sate Circuits, vol. 37, No. 3, March 202, pp. 371-383.

International Search Report and Written Opinion—PCT/US2015/033729 ISA/EPO—Aug. 24, 2015.

Yoo S-M., et al., "A power-combined switched-capacitor power amplifier in 90nm CMOS", Radio Frequency Integrated Circuits Symposium (RFIC), IEEE, Jun. 5, 2011, pp. 1-4, XP032002348, DOI: 10.11 09/RFIC.2011.5940622 ISBN: 978-1-4244-8293-1.

Yoo S-M., et al., "A Switched-Capacitor RF Power Amplifier", IEEE Journal of Solid-State Circuits, Dec. 2011, vol. 46, No. 12, pp. 2977-2987.

Aoki, et. al.; "A Fully-Integrated Quad-Band GSM/GPRS CMOS Power Amplifier"; IEEE Journal of Solid-State Circuits, vol. 43, No. 12, (Dec. 2008) pp. 1-12.

Aoki, et. al. "A Fully Integrated Quad-Band GSM/GPRS CMOS Power Amplifier"; Presented by Axiom Microdevices Inc., IEEE International Solid-State Circuits Conference; (2008) pp. 1-33.

Aoki, et. al; "A Fully Integrated Quad-Band GSM/GPRS CMOS Power Amplifier"; ISSCC 2008 / Session 31 / RF & mm-Wave Power Amplifiers / Chapter 31.7, IEEE International Solid-State Circuits Conference (978-4244-2011-7) (2008) pp. 1-3.

Lu et al.: "A 24.7dBm All-Digital RF Transmitter for Multimode Broadband Applications in 40nm CMOS", ISSCC 2013; Session 19; Wireless Transceivers for Smart Devices/19.3; 2013 IEEE International Solid-State Circuits Conference; 3 pages.

Yoo S-M., et al., "A Switched-Capacitor Power Amplifier for EER/Polar Transmitters", 2011 IEEE International Solid-State Circuits Conference, Feb. 23, 2011, pp. 428-430.

* cited by examiner

SWITCHED CAPACITOR TRANSMITTER CIRCUITS AND METHODS

CROSS REFERENCE TO RELATED APPLICATIONS

Pursuant to 35 U.S.C. §119(e), this application is entitled to and claims the benefit of the filing date of U.S. Provisional App. No. 62/017,060 filed Jun. 25, 2014 and U.S. Provisional App. No. 62/063,863 filed Oct. 14, 2014, the content of U.S. Provisional App. No. 62/017,060 and the content of U.S. Provisional App. No. 62/063,863 are hereby incorporated herein by reference in their entireties. This application is related to concurrently-filed U.S. patent application Ser. No. 14/681,008, the content of which is hereby incorporated herein by reference in its entirety.

BACKGROUND

The present disclosure relates to electronic circuits and methods, and in particular, to switched capacitor transmitter circuits and methods.

Digital transmission involves the physical transfer of data (a digital bit stream or a digitized analog signal) between electronic systems. FIG. 1 illustrates a typical arrangement for transmitting data between two electronic systems. Electronic system 101 may include digital processing circuits 110 (e.g., a CPU and memory) storing digital data 112. Electronic system 101 may send digital data 112 to another electronic system 102 using a transmitter (Tx) 114. Transmitter 114 receives the digital data 112 and converts the digital data into an analog signal for transmission across a communication medium 103. In a wireless application, analog signals may be upconverted to radio frequency signals and then broadcast between antennas through the air, for example. Electronic system 102 includes a receiver 124 (Rx) for receiving the digital data 112. In this example, electronic systems 101 and 102 can both send data using a transmitter (Tx) and receive data using a receiver (Rx). Accordingly, electronic system 102 may also include digital processing circuits 120 storing digital data 122 that may be sent to electronic system 101 using transmitter 124, for example.

FIG. 2 illustrates an example prior art architecture for transmitting data in a wireless channel. In a wireless transmission channel, a digital data signal comprising encoded data is converted to an analog signal using a digital-to-analog converter (DAC) 201. The analog signal (or analog "baseband" signal) is then processed using a low pass filter (LPF) 202 and gain stage (Av) 203. The analog baseband signal is then shifted to a carrier frequency using upconverter 204 and a local oscillator (LO). The upconverted signal is filtered again at 205. A power amplifier 206 increases the power of the analog signal for transmission across the communication medium.

Power consumption is a significant problem in contemporary transmission systems. The rapid expansion of communication systems, such as wireless devices, has tightened the power consumption requirements of devices, and transmitters are a large source of such consumption. Traditional analog power amplifiers, for example, consume particularly large amounts of power. Improving the efficiency of such analog power amplifiers is an area of continued research.

SUMMARY

The present disclosure includes switched capacitor transmitter circuits and methods. In one embodiment, the present disclosure includes a plurality of switched capacitor transmitter circuits coupled to inputs of an inductive network. The inductive network combines voltages from the switched capacitor transmitter circuits to produce a combined voltage on an output. In another embodiment, a digital data signal is thermometer encoded and a negative thermo-encoded signal is bit order reversed to control capacitors in a switched capacitor transmitter circuit.

The following detailed description and accompanying drawings provide a better understanding of the nature and advantages of the present disclosure.

DETAILED DESCRIPTION

The present disclosure pertains to switched capacitor transmitter circuits and methods. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Embodiments of the present disclosure include new transmission techniques. In one embodiment, the present disclosure includes an innovative switched capacitor transmitter circuit and power combiner circuit. In another embodiment, the present disclosure includes innovative digital processing techniques for driving a switched capacitor circuit. Other aspects of the disclosure may be understood with reference to the examples below.

Power Combining in a Switched Capacitor Transmitter

Figure 1:
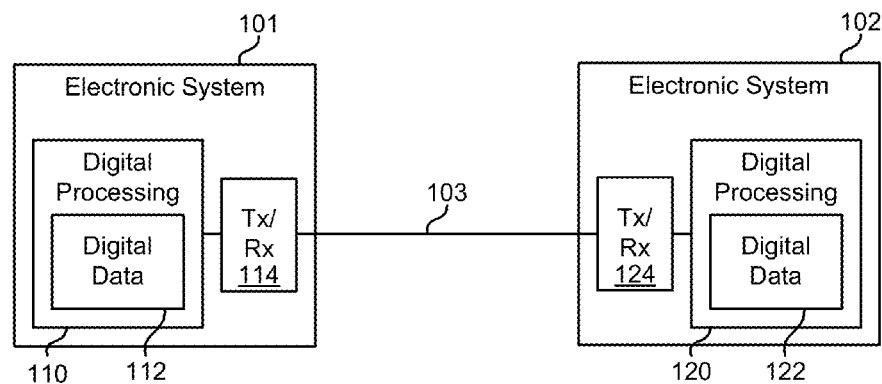
FIG. 1 illustrates a typical arrangement for transmitting data between two electronic systems.
Figure 2:
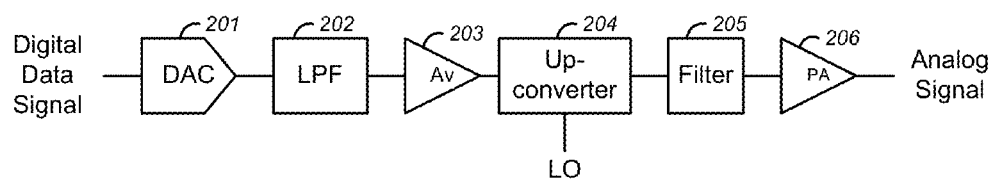
FIG. 2 illustrates a typical architecture for transmitting data.
Figure 3:
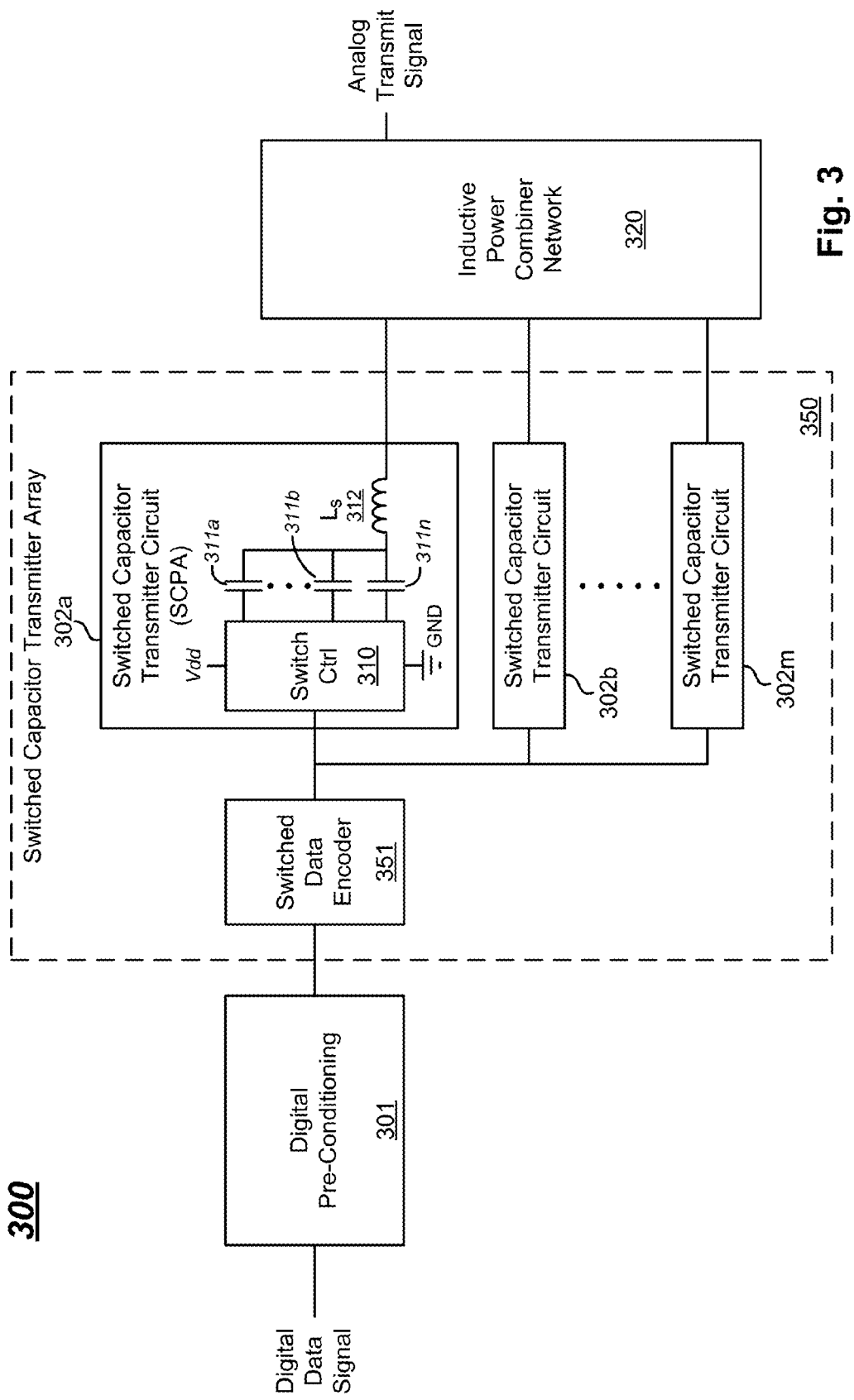
FIG. 3 illustrates a switched capacitor transmitter according to an embodiment.

FIG. 3 illustrates a switched capacitor transmitter according to an embodiment. A digital data signal is received by a digital pre-conditioning circuit 301 and provided to a switched capacitor transmitter array 350. As described in more detail below, pre-conditioning may include interpolation or delta-sigma modulation and/or other functions, for example. Delta-sigma modulation may, for example, enable a reduced number of bits in the binary representation of the digital RF waveform by reducing the power spectral density of the quantization noise associated with the reduced number of bits in critical frequency band(s), for example. In turn, the reduced number of bits may enable thermometer encoding to unit elements. In some example embodiments, this may be critical to maintain element matching necessary to maintain linearity in the digital to analog conversion necessary for achieving necessary low-levels of signal distortion for meeting transmitter in-band signal-to-distortion levels as well as out-of-band spurious emissions requirements. In the example shown in FIG. 3, switched capacitor transmitter array 350 includes a switched data encoder 351 and a plurality of switched capacitor transmitter circuits 302a-m. Switched capacitor transmitter circuits 302a-m are sometimes referred to as switched capacitor power amplifier circuits ("SCPAs"). As described in more detail below, each SCPA includes a plurality of capacitors 311a-n and an inductor Ls 312. The plurality of capacitors are switchably coupled between a power supply terminal Vdd and a reference voltage terminal, which in this example is ground (GND).

The output of digital pre-condition circuit 301 is received by the switched data encoder 351. As described in more detail below, switched data encoder 351 may code the digital signals to control switches coupled to the SCPA capacitors to selectively couple a terminal of each capacitor to Vdd or ground. As more capacitors are coupled to Vdd, the amplitude of the voltage at the output of the switched capacitor transmitter array 350 increases, and as fewer capacitors are coupled to Vdd, the amplitude of the voltage at the output of the switched capacitor transmitter array 350 decreases. Voltages from a plurality of SCPA capacitor arrays may be combined using an inductive power combiner network 320. Inductive power combiner network includes a plurality of inputs coupled to a plurality of outputs of the plurality of switched capacitor transmitter circuits 302a-m. As described in more detail below, each SCPA may advantageously comprise an inductor Ls 312 coupled between capacitor terminals and an SCPA output. Embodiments of the disclosure may include a variety of advantageous configurations for coupling the SCPA inductors to inductive networks for combining voltages from the plurality of switched capacitor transmitter circuits to produce a combined voltage output. Accordingly, the inductive power combiner network 320 may combine voltages from the SCPAs to produce an analog transmit signal. The analog transmit signal may be provided to an antenna, for example, or other mechanism for coupling the analog transmit signal to a communication medium.

Figure 4:
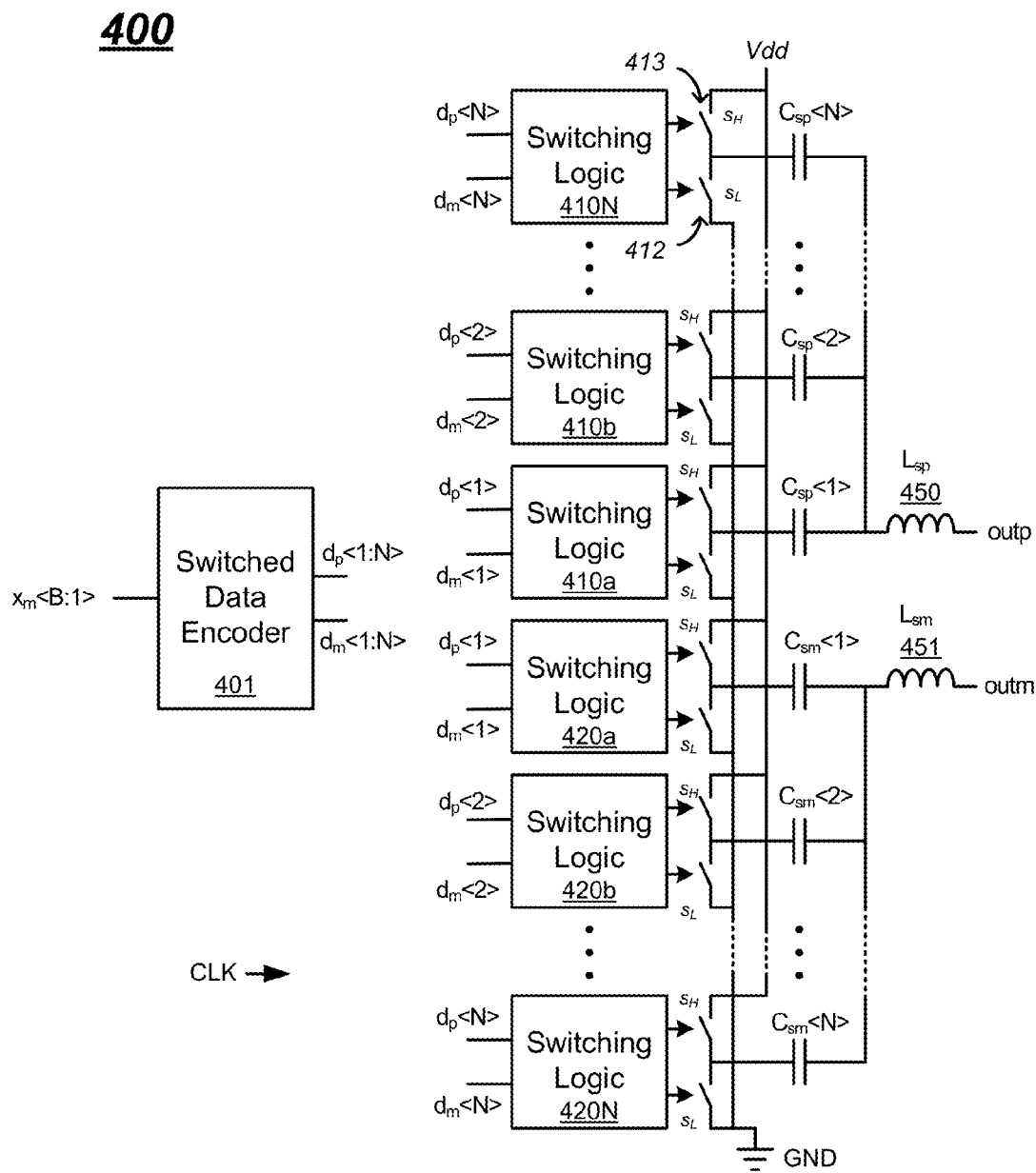
FIG. 4 illustrates an example switched capacitor transmitter circuit according to an embodiment.

FIG. 4 illustrates an example switched capacitor transmitter circuit (SCPA) according to an embodiment. This example illustrates an SCPA with a differential output and differential output inductors Lsp 450 and Lsm 451. SCPA 400 comprises two (2) capacitor arrays with N capacitors each (Csp1-CspN and Csm1-CsmN). One terminal of each capacitor is coupled to Vdd through a first switch ($S_H$), such as switch 413, and to ground through a second switch ($S_L$), such as switch 412. A second terminal of each of the N capacitors (on the positive side of the array) is coupled to a first terminal of positive output inductor 450. A second terminal inductor 450 provides the positive output (outp) of SCPA 400. Similarly, a second terminal of each of the second N capacitors (on the negative side of the array) is coupled to a first terminal of negative output inductor 451. A second terminal inductor 450 provides the negative output (oupm) of SCPA 400.

Capacitors in the SCPA are switched between ground and Vdd couple charge to the respective inductors, which produces a voltage on the output terminals outp and outm. Control of the capacitors may increase or decrease the differential voltage across outp and outm, for example. Accordingly, the capacitors in the SCPA may be controlled by switching logic circuits 410a-N and 420a-N that receive a plurality of switch control signals to turn the switches on and off, and in accordance therewith, convert the digital data signal into analog voltages. In this example, each switching logic circuits receives a bit line output from a switched data encoder 401. For example, switched data encoder 401 receives a digital data signal Xm, which may be a B-bit length signal. The signal may be encoded to drive switches so that the SCPA produces the desired voltage output signal. In one example embodiment described in more detail below, switched data encoder 401 may use thermo-encoding and bit order reversal to produce an encoded signal. Switched data encoder 401 produces an N-bit digital output signal "dp<1:

N>" and an N-bit digital output signal "dm<1:N>" for driving the switching logic circuits 410a-N and 420a-N. In this example, for the positive output (outp), dp<1> and dm<1> control switching of a first positive side capacitor Csp<1>, dp<2> and dm<2> control switching of a second positive side capacitor Csp<2>, and so on to dp<N> and dm<N> to control switching of an Nth positive side capacitor Csp<N>. Similarly, for the negative output (outm), dp<1> and dm<1> control switching of a first negative side capacitor Csm<1>, dp<2> and dm<2> control switching of a second negative side capacitor Csm<2>, and so on to dp<N> and dm<N> to control switching of an Nth negative side capacitor Csm<N>. A clock signal, CLK, may also be provided for controlling the timing. For example, switching logic circuits 410 and 420 may receive CLK to control the time of capacitor switching. Switching logic circuits 410 and 420 may control switches 412, 413 and the like so that the positive output (outp) and negative output (outm) are together a differential signal.

Figure 5:
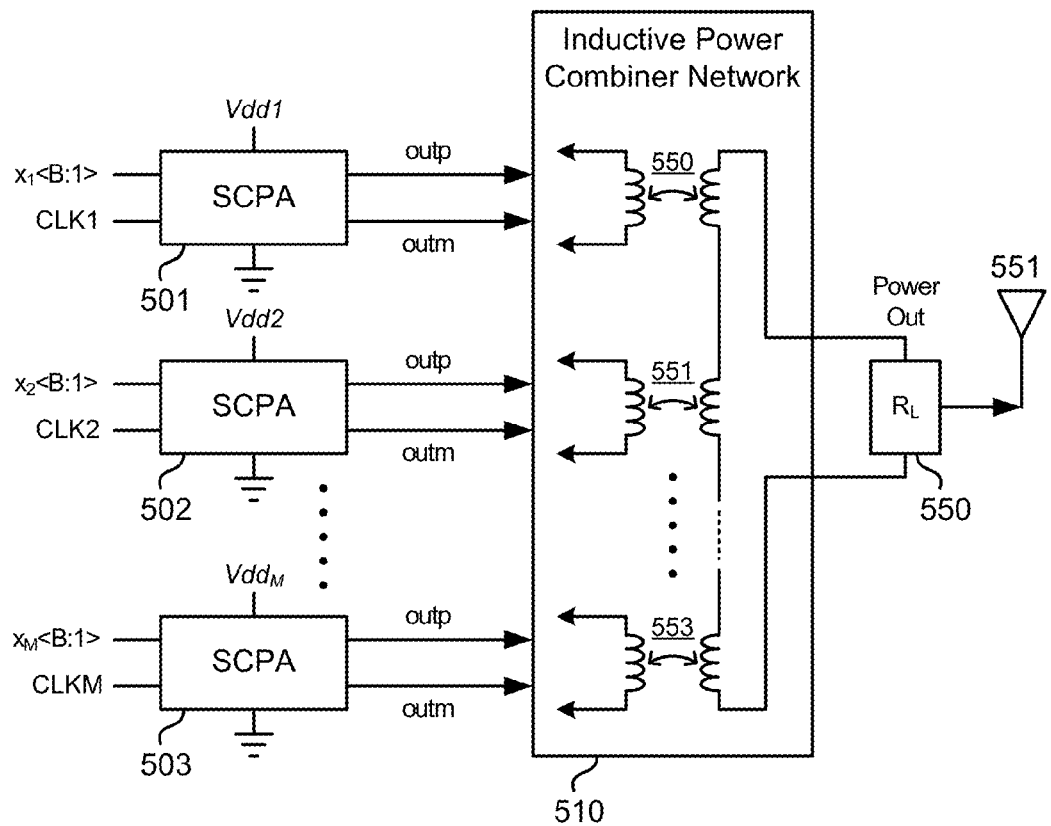
FIG. 5 illustrates a plurality of switched capacitor transmitter circuits coupled to a power combining network according to an embodiment.

FIG. 5 illustrates a plurality of switched capacitor transmitter circuits coupled to a power combining network according to an embodiment. In this example, digital data signals X1-M are received at the inputs of M-SCPAs 501-503 to produce M analog outputs. Voltage from the M outputs may be combined in inductive power combiner network 510. In this example, inductive power combiner network 510 comprises multiple mutually inductive components, where the mutual inductance is used to combine power at the inputs to produce a combined voltage output signal. The combined voltage at the output may be provided to a load ($R_L$) 550. For example, in one embodiment the transmitter circuits are used in a wireless transmitter, and the output of the transmitter $R_L$ 550 is coupled to an antenna 551.

Figure 6A:
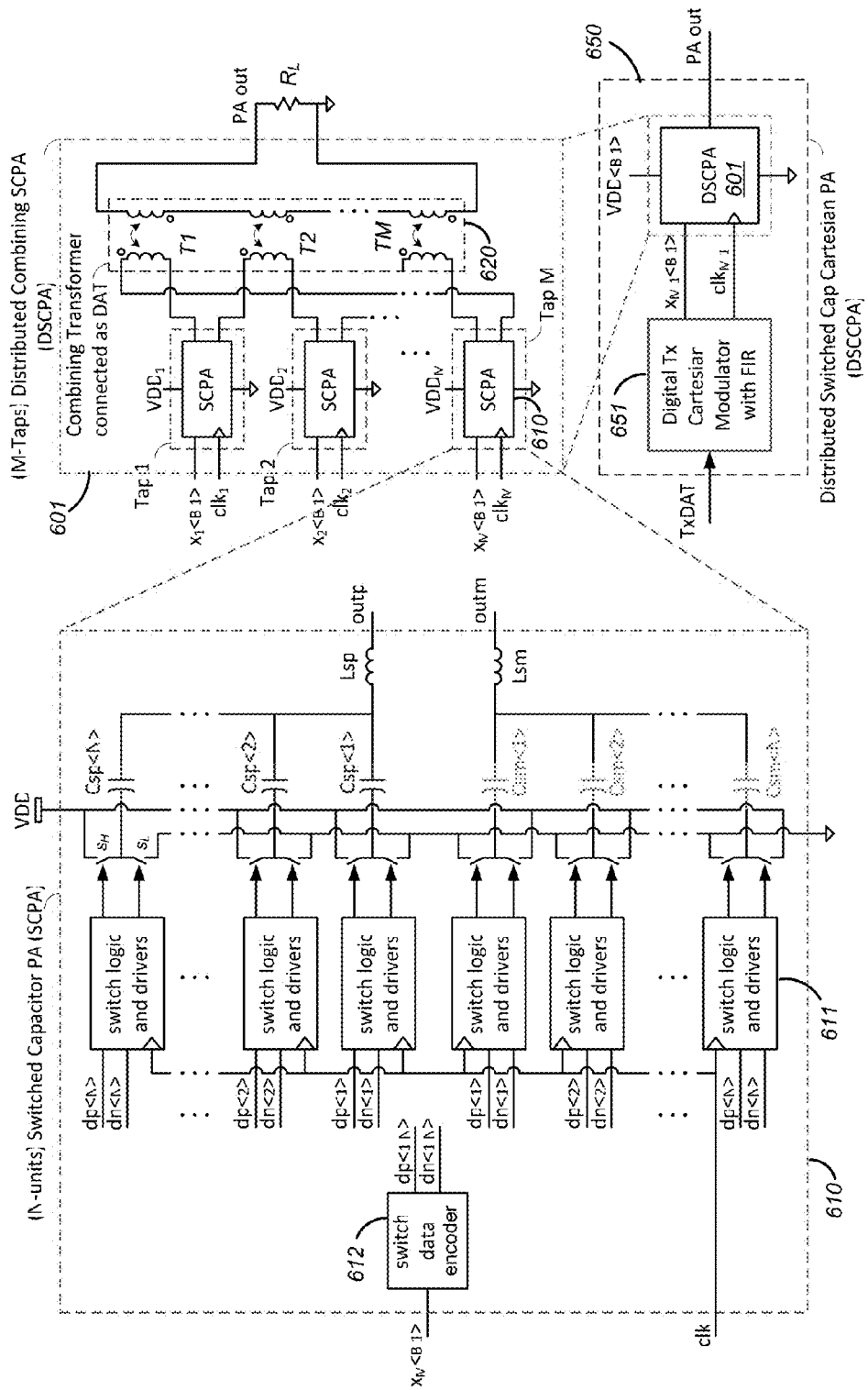
FIG. 6 illustrates an example transmitter according to one embodiment.

FIG. 6 illustrates an example transmitter according to one embodiment. Transmitter 650 receives a digital data signal (TxDAT) in a pre-processor 651. In this example, the pre-processor includes a digital Cartesian modulator that may include a finite impulse response (FIR) filter. Pre-processor 651 produces a B-bit digital data signal and may produce a clock signal CLK, for example. The outputs of pre-processor 651 are received on inputs of a distributed switched capacitor power amplifier (DSCPA) 601. DSCPA 601 produces an analog output signal PA out, which may be coupled to an antenna, for example.

In this example, an expanded detailed view of DSCPA 601 illustrates M SCPAs (M-taps) driving a distributed transformer 620. A transformer is an electrical device that transfers energy between two or more circuits through electromagnetic induction. A distributed transformer is an inductive network including a plurality of mutually inductive components. Typically, the mutually inductive components include a first inductive component (e.g., a winding) having a first pair of terminals (sometimes referred to as the primary) and second inductive component (e.g., a secondary winding) having a second pair of terminals (sometimes referred to as the secondary). A varying current in the transformer's primary winding creates a varying magnetic field on the secondary winding. This varying magnetic field at the secondary induces a varying electromotive force (EMF) or voltage in the secondary winding. In this example, primary inputs of multiple primary inductive components are coupled to outputs of the plurality of SCPAs and the inductive components in the secondary are configured in series to produce a combined voltage at the output. As illustrated below, a number of different configurations of a distributed transformer may be used according to various embodiments. Advantageously, inductors may be included in the SCPAs. Such inductors may filter the switching signals from the capacitors, reduce power losses, and/or introduce a degree of freedom with respect to possible configurations of the inductive components in the distributed transformer, for example.

In this example, an expanded detailed view of SCPA 610 shows a switch data encoder 612, a plurality of switch logic drivers 611 controlling switches SH and SL to switchably couple terminals of capacitors Csp<1:N> and Csm<1:N> between a power supply terminal, Vdd, and a reference voltage terminal (e.g., ground). Embodiments may include applications where the Vdd of different SCPAs is different. In this example, different SCPAs may have different supply voltages Vdd1 . . . VddM, for example. Each SCPA includes a positive output inductor Lsp and a negative output inductor Lsm. Features and advantages of the present disclosure include output inductors in each SCPA. The incorporation of these series inductors improves the overall efficiency by blocking harmonic switching power loss of an SCPA, before the power combiner. One problem with an inductive power combiner is that the inductance in the combiner itself can block harmonic switching power loss to the PA output load, but it still allows it to couple back through the primary windings to each of the other taps where it is dissipated (wasted) in the source resistances of the SCPAs connected to those other taps. The amount of SCPA series output inductance is a tradeoff between this blocking efficiency vs. the coupling efficiency of the combiner.

FIG. 6 shows an embodiment of the switched capacitor transmitter circuit where a first output of each switched capacitor transmitter circuit is coupled to a first terminal of an inductive element in the distributed transformer and a second output of each switched capacitor transmitter circuit is coupled to a first terminal of a different adjacent inductive element in the distributed transformer. For instance, in FIG. 6, taps of the SCPAs are coupled to a distributed transformer power combiner 620 such that the positive and negative outputs of each SCPA are connected to terminals of separate, adjacent primary transformers, respectively. For example, the positive output, outp, of SCPA Tap 1 may be coupled to a primary terminal of a first transformer, T1, whereas the negative output, outm, of SCPA Tap 1 may be coupled to a primary terminal of another transformer, T2. The other SCPA taps may be similarly configured such that the positive output of SCPA Tap M is coupled to the Mth transformer, TM, and the negative output of SCPA Tap M is coupled to the first transformer, T1.

Figure 6B:
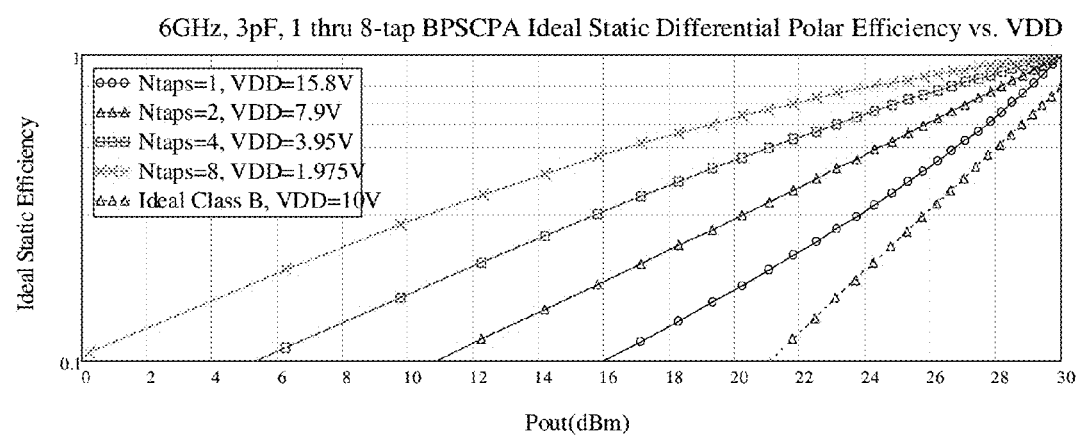

Features and advantages of the present disclosure include increasing the number of SCPA taps to increase the amplitude of the PA output voltage. Combining multiple taps (Ntaps) enables reduction in the power supply voltage by a factor of 1/Ntaps and an improvement in efficiency in a manner equivalent to reducing switching capacitance. The following example equations illustrate static efficiency versus output power as functions of digital code, n, for polar modulation. FIG. 6B illustrates efficiency improvement using the techniques described herein for one example implementation.

$$P_{out}(n, N_{taps}) = \sum_{i=1}^{N_{tap}} V_{C_{P_i}}(n)^2 = N_{taps}^2 \frac{2}{\pi^2}\left(\frac{n}{N}\right)^2 \frac{V_{DD}^2}{R_L},$$

-continued $$P_{sc}(n, N_{taps}) = \sum_{i=1}^{N_{tap}} P_{sc_i}(n) = N_{taps}F_s \frac{n(N-n)}{N^2}C_sV_{DD}^2,$$

$$n_{ideal\_polar}(n, N_{taps}) = \frac{P_{out}(n, N_{taps})}{P_{out}(n, N_{taps}) + P_{sc}(n, N_{taps})}$$

$$= \frac{1}{1 + \frac{1}{N_{taps}}\left[\frac{(N-n)}{n}\right]\frac{F_sR_LC_s\pi^2}{2}}$$

Where Ntaps is the number of SCPA switching elements, Fs is the switching frequency, Cs is the total switching capacitance, Vdd is the switching power supply level, and RL is the output load resistance.

The output voltage for the transmitter is as follows:

$$V(PA \text{ out}) = \sum_{i=0}^{M} V(outp_i)$$

Figure 6C:
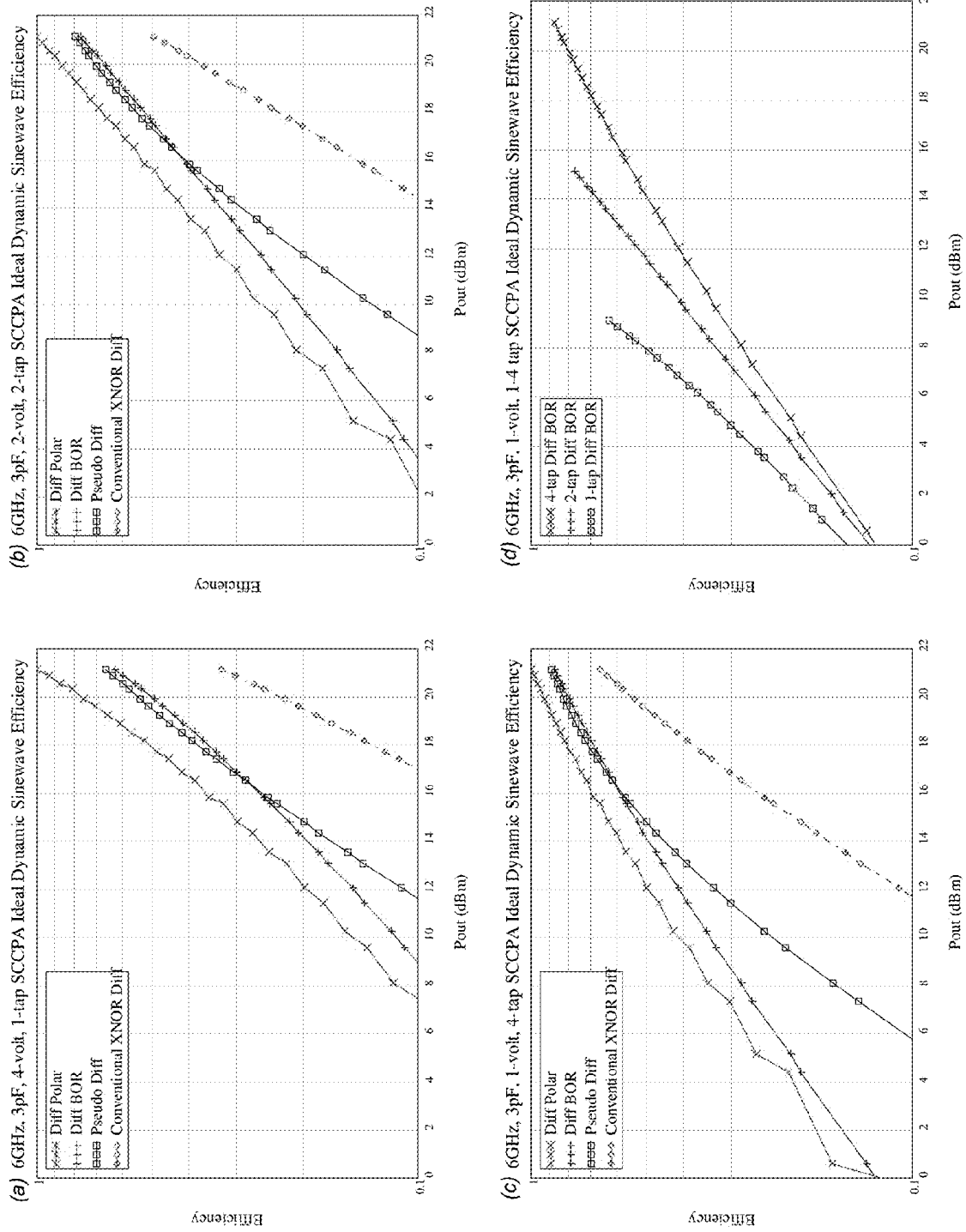

FIG. 6C illustrates similar advantageous results for an example implementation using Cartesian modulation, which is discussed in more detail below.

Figure 7:
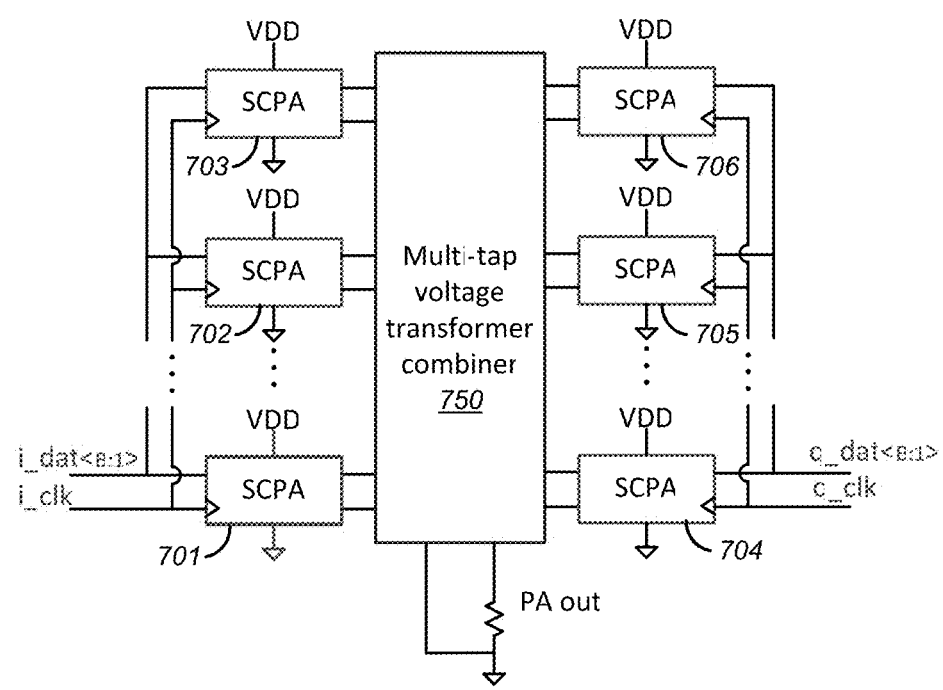
FIG. 7 illustrates an example power combiner including in-phase (I) signals and quadrature (Q) signals according to one embodiment.

FIG. 7 illustrates an example power combiner including in-phase (I) signals and quadrature (Q) signals according to one embodiment. In this example, a first plurality of the switched capacitor transmitter circuits (SCPAs) couple an in-phase (I) component of the digital data signal to inputs of a distributed transformer, and a second plurality of the switched capacitor transmitter circuits (SCPAs) couple a quadrature (Q) component of the digital data signal to a second plurality of inputs of the distributed transformer. In this example, SCPAs 701-703 may receive an in-phase digital data signal i_dat<B:1> and an in-phase clock i_clk, for example. Similarly, SCPAs 704-706 may receive an quadrature digital data signal q_dat<B:1> and a quadrature clock q_clk, for example. In this example, the number of in-phase SCPAs is equal to the number of quadrature SCPAs. The output voltages of the SCPAs may be combined in the multi-tap voltage transformer combiner to produce a combined I/Q voltage signal at the output, for example.

Figure 8:
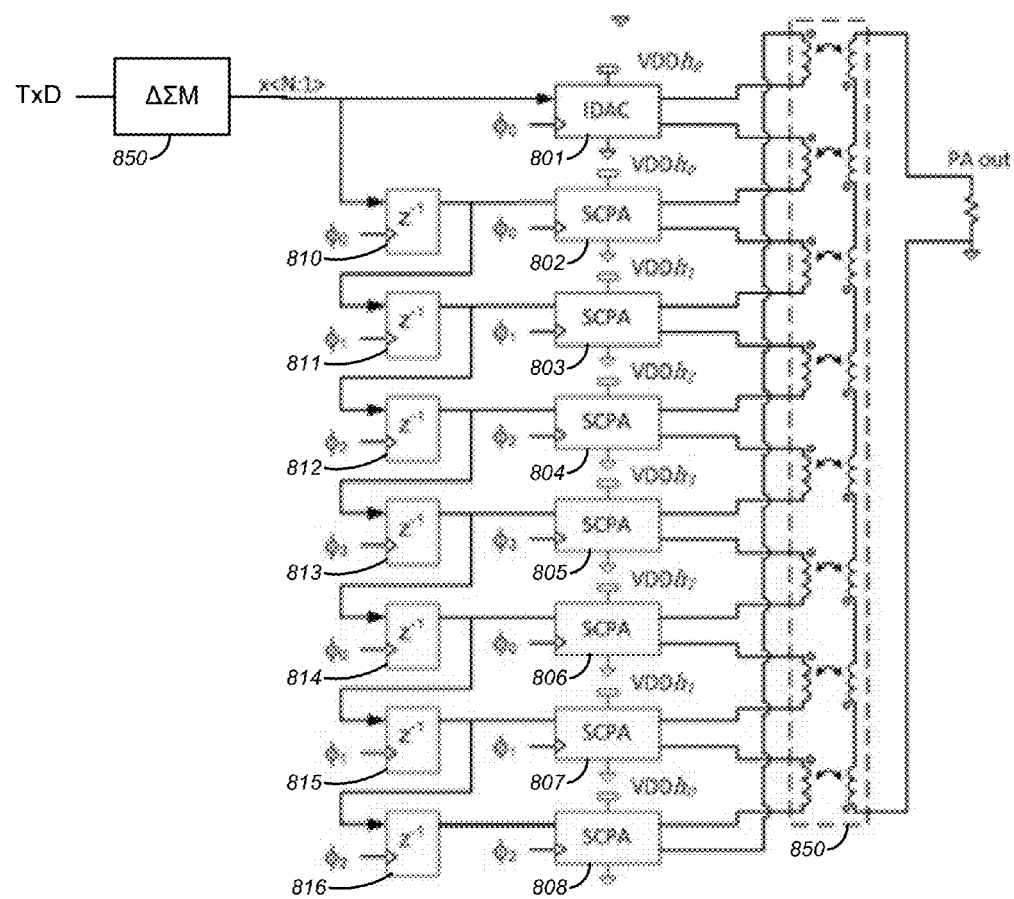
FIG. 8 illustrates an example transmitter including a filter according to one embodiment.

FIG. 8 illustrates an example transmitter implementing a finite impulse response (FIR) filter transfer function according to one embodiment. In some embodiments, pre-processing may include filtering the digital data signal. In this example, a digital data signal TxD is processed by a delta sigma converter. The digital data signal is then successively coupled through a plurality of series delay circuits ($Z^{-1}$) to the plurality of switched capacitor transmitter circuits to filter the digital data signal. Each output of a delay circuit may be weighted by coupling different power supply voltages to the different SCPAs. In this example, the output of the delta sigma modulator, TxData, is coupled to a digital-to-analog converter 801 having a power supply voltage Vdd*h0. TxData is sequentially coupled through delay circuits 810-816 to the inputs of SCPAs 802-808, respectively. SCPA 802-808 receive power supply voltages Vdd times h0, h1, h2, h3, h2, h1 and h0, respectively. According to eq(2) the output voltages of the SCPAs are proportional to the supply voltages of the SCPAs and if the SCPA outputs are summed with equal residual delays through the combiner then the transmitter will produce an onput, y(z)=h(z)*x(z), where y(z) is the Z-transforms of the output voltage, x(z) is the Z-transform of the digital input signal, and h(z)=$\Sigma_n h_n z^{-n}$ are the filter weights implemented here using supply voltage weights, hn. This embodiment also shows an example in which the signal passes through an alternate type of DAC, 801, such as a current-mode DAC and is transferred to the PA output through the combiner. This may be useful to transmit power levels below the minimum practical level of the SCPAs.

Figure 9:
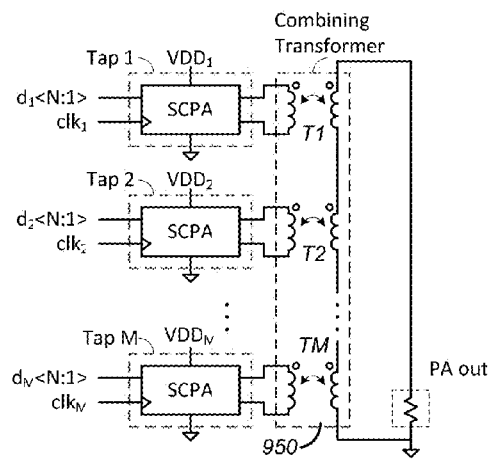
FIG. 9 illustrates an example power combiner according to another embodiment.

FIG. 9 illustrates an example power combiner according to another embodiment. In this example, the distributed transformer comprises a plurality of inputs coupled to outputs of the plurality of switched capacitor transmitter circuits. In particular, a power combining transformer 950 includes M transformer element with M primaries and M series configured secondaries coupled to an output. A first SCPA, Tap 1, receives Vdd1 and has first and second output driving first and second inputs of the primary of T1. A second SCPA, Tap 2, receives Vdd2 and has first and second output driving first and second inputs of the primary of T3. Likewise, the Mth SCPA, Tap M, receives VddM and has first and second output driving first and second inputs of the primary of TM. In some embodiments the power supply voltage levels may be the same, and in other embodiments the supplies may be different values, for example.

Figure 10:
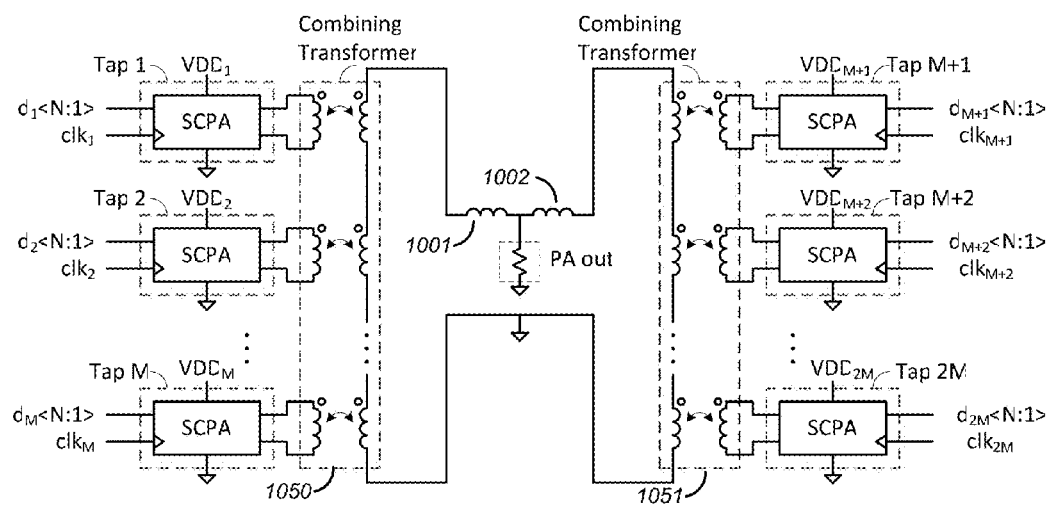
FIG. 10 illustrates an example power combiner according to yet another embodiment.

FIG. 10 illustrates an example power combiner according to yet another embodiment. In this example, a plurality of distributed transformers may be used to combine voltages from different SCPA taps. In this example, two distributed transformers are configured as a coupled-line transformer arrangement driven by 2M SCPAs, for example. A first M SCPAs (Taps 1-M) drive distributed transformer 1050 and a second M SCPAs (Taps M+1 to 2M) drive distributed transformer 1051. The series configured secondaries of distributed transformers 1050-1051 may be coupled to the output through inductors 1001 and 1002, for example, where voltages are combined to produce an analog output voltage.

Figure 11:
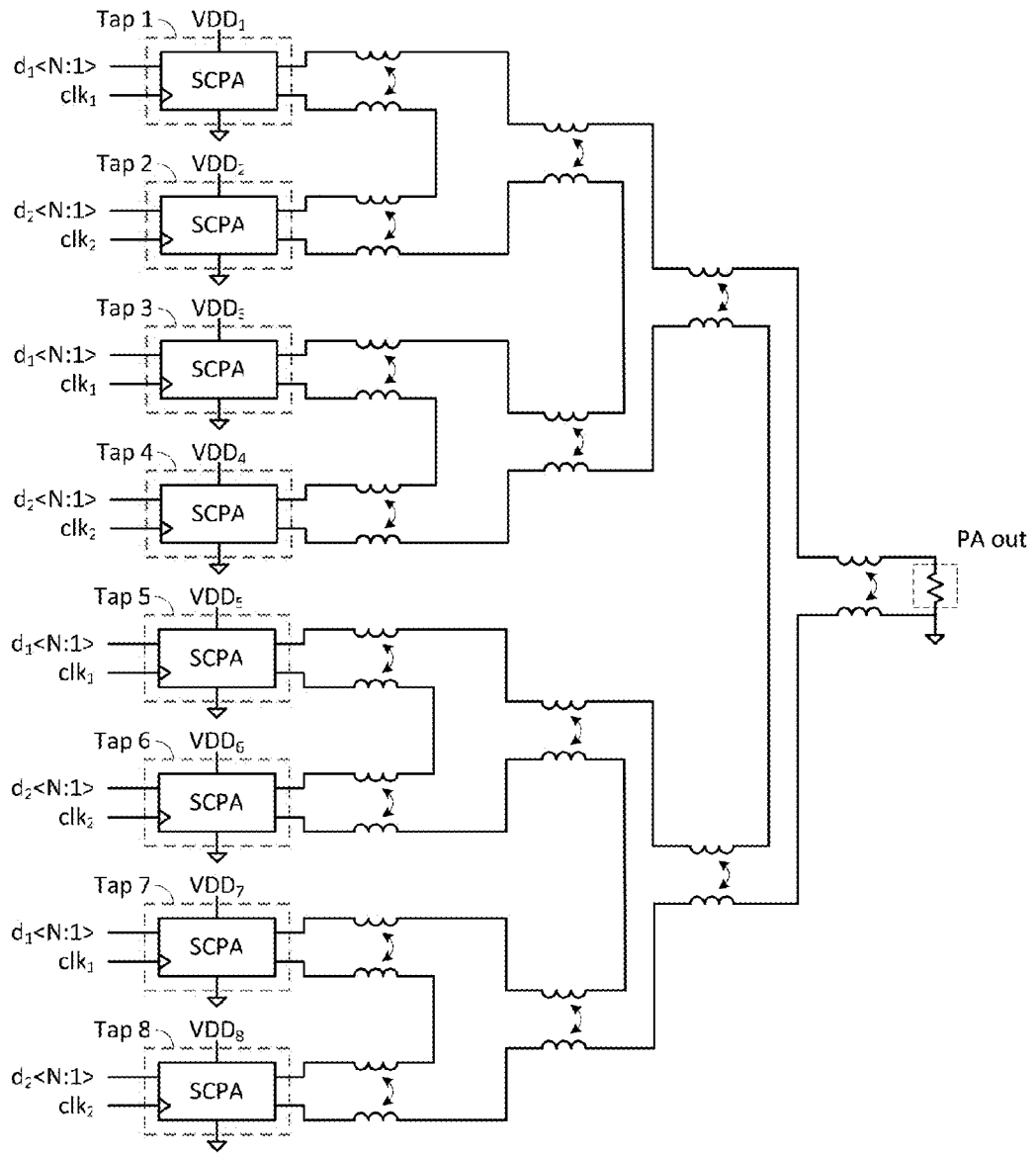
FIG. 11 illustrates an example power combiner configured in a hierarchy according to another embodiment.

FIG. 11 illustrates an example power combiner configuration in a hierarchy according to other embodiments. In this example implementation, a plurality of transformers are configured in hierarchies to combine voltages from the SCPAs. In FIG. 11, the outputs of the SCPAs drive terminals of the primary and secondary of each transformer. The other terminals of the primary and secondary are arranged in "corporate" or "championship" hierarchy structure where voltages are successively combined two at a time, for example, until a final combined output voltage is obtained.

Figure 12:
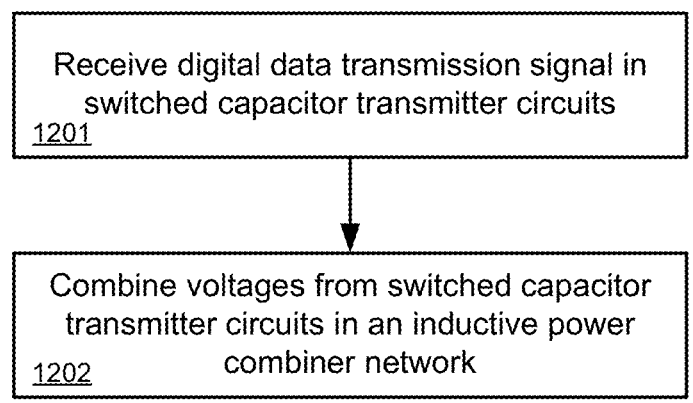
FIG. 12 illustrates a method according to one embodiment.

FIG. 12 illustrates a method according to one embodiment. At 1201, a digital data transmission is received in a plurality of switched capacitor transmitter circuits. At 1202, voltages from the switched capacitor transmitter circuits are combined in an inductive power combiner network. For example, the power combiner network may be a distributed transformer as described above.

FIGS. 13A-E illustrate example circuit layout implementations of power combiners according to certain embodiments. The transformer implementations may allow area efficiency and packaging design improvements by enabling the combiner layout to either circumscribe or inscribe the active electrical circuitry of the SCPAs.

Figure 13A:
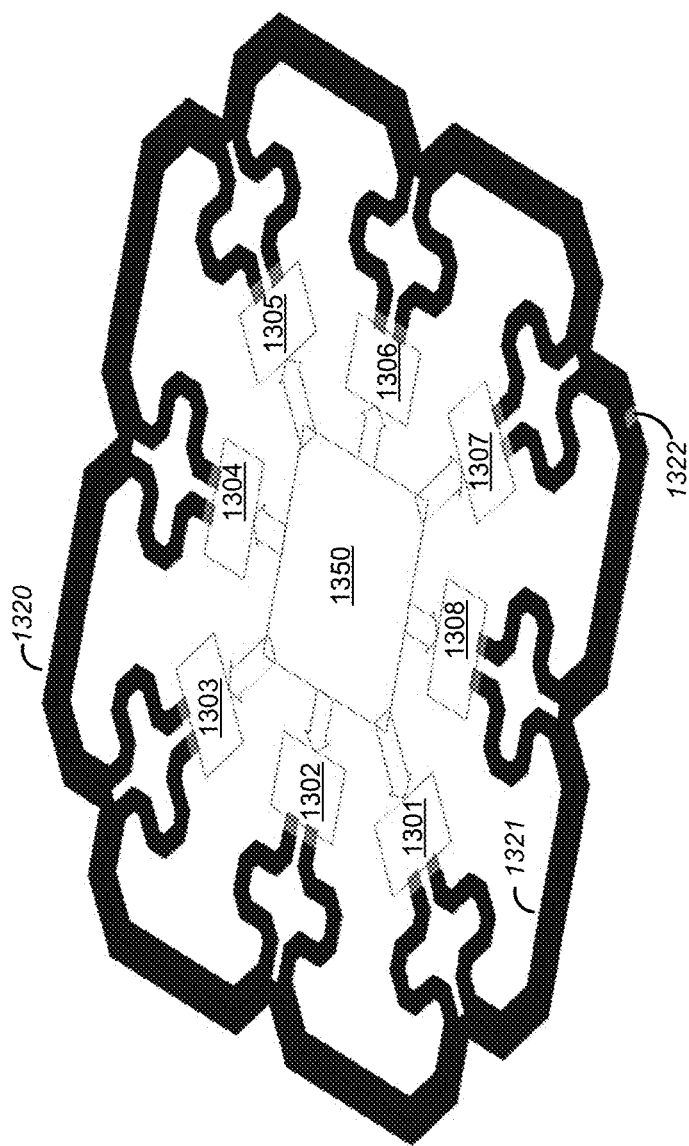
FIGS. 13A-E illustrate example circuit layout implementations of power combiners according to certain embodiments.

In FIG. 13A, a plurality of switched capacitor power amplifiers (SCPAs) 1301-1308 are coupled to a distributed transformer comprising a plurality of interior (or inner) inductive components, such as inductive component 1321 between SCPA 1301 and SCPA 1308, for example. SCPAs 1301-1308 may receive digital signals from a digital processor 1350, for example. The voltages generated by SCPAs 1301-1308 are combined in an exterior (or outer) inductive component 1320 that is magnetically coupled to the interior inductive components to produce an output at 1322, for example.

Figure 13C:
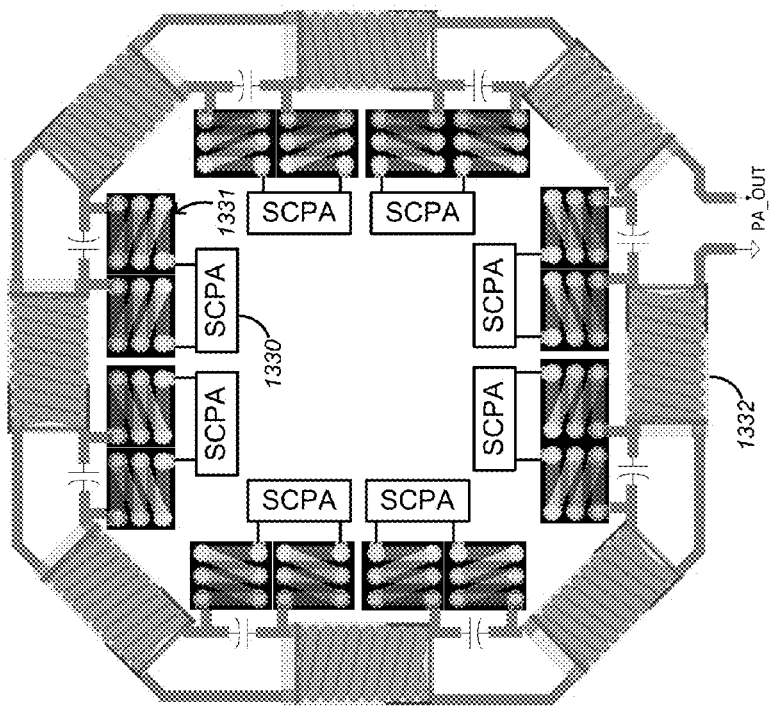
Figure 13B:
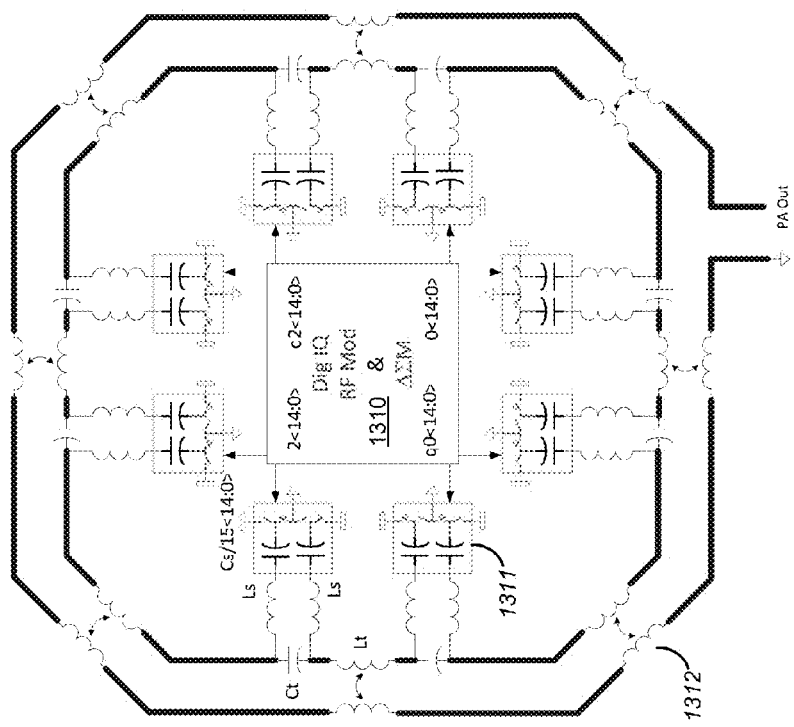

FIG. 13B illustrates another example distributed transformer. In this example, a digital I/Q RF modulator and delta sigma modulator 1310 generate I and Q signals that are coupled through SCPAs 1311 and combined in distributed transformers 1312 as shown to produce a combined output voltage at PA out.

FIG. 13C illustrates yet another example comprising solenoids. SCPAs 1330 each drive two solenoids 1331, which in turn drive magnetically coupled inductive windings 1332 to produce a combined output voltage at PA out.

Figure 13D:
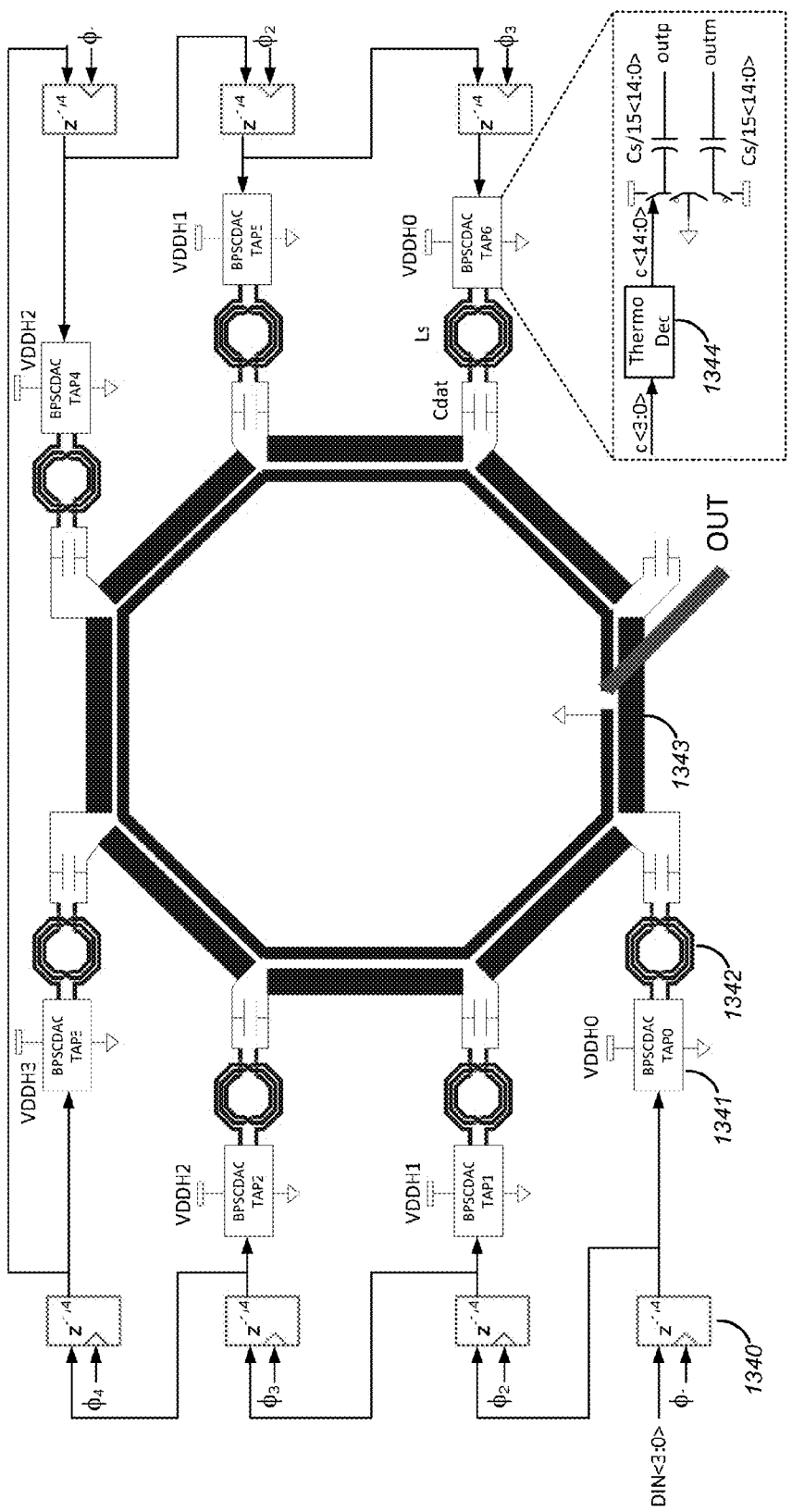

FIG. 13D illustrates another example where band pass switched capacitor digital to analog converter (BPSCDAC) taps 0-6 1341 receive a successively delayed digital data signal, DIN, through delay elements 1335 having individual power supply voltage levels, VDDH0-3, thus jointly implementing a finite impulse response filter transfer function. Each BPSCDAC 1341 may include a thermo encoder 1344 as described in more detail below, for example. Outputs of BPSCDACs 1341 are coupled through output inductors 1342 arranged as shown in a distributed active transformer configuration to magnetically coupled elements 1343 comprising exterior segments coupled between output inductors 1342 and a continuous interior element having a terminal coupled to ground and a second terminal to produce a combined output voltage at OUT.

Figure 13E:
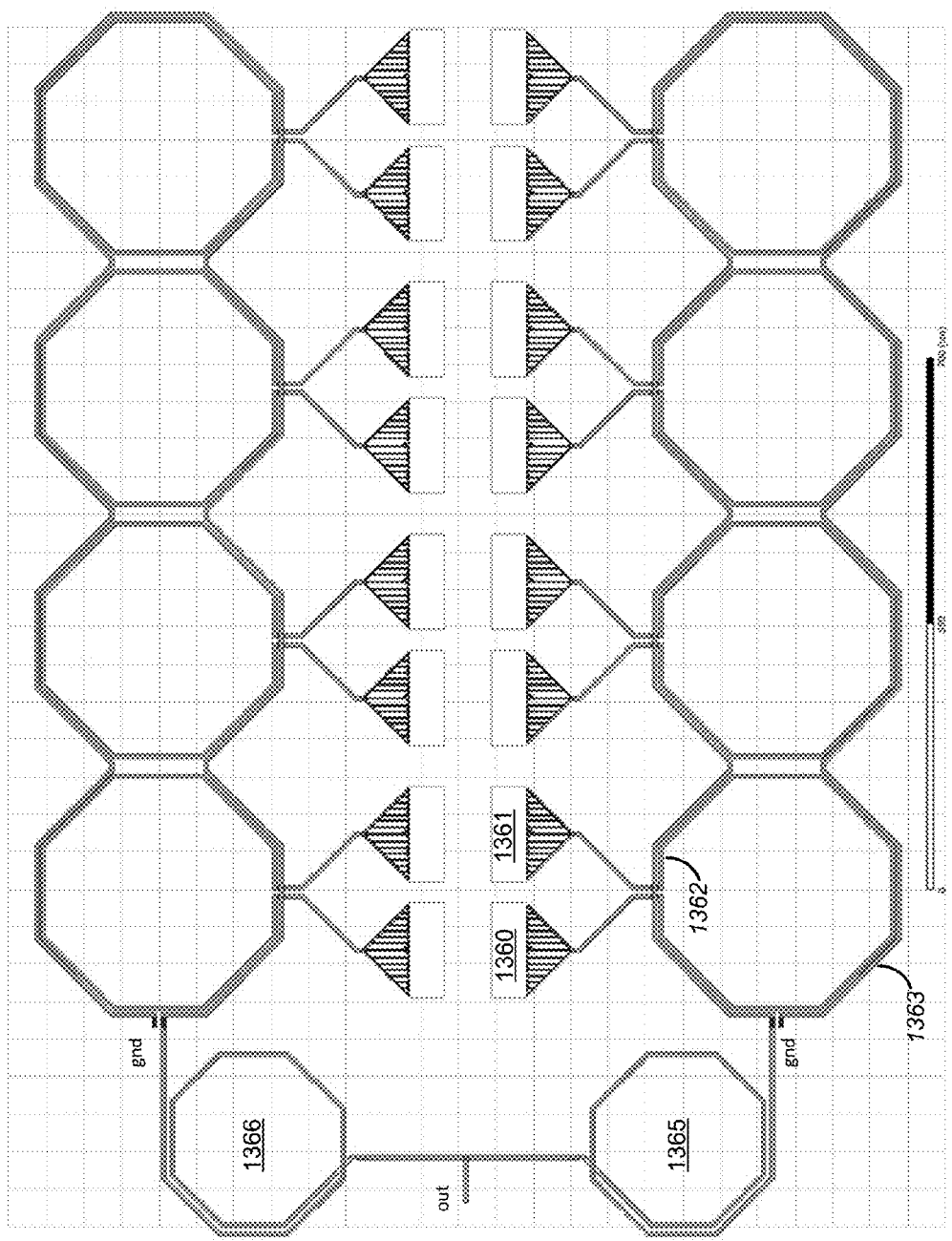

FIG. 13E illustrates another example power combiner. In this example arrangement, SCPA pairs 1360 and 1361 with feed-lines for each unit-element switching capacitor drive an interior loops 1362. The feed-lines together with the segment of conductor between the feed-lines and the interior loops jointly implement each SCPA inductor. The loops 1362 are magnetically coupled to an exterior loop having one terminal coupled to ground and a second terminal coupled to OUT. In this example, first and second exterior loops are coupled through coils 1365 and 1366 and to OUT to produce a combined output voltage at OUT.

Cartesian Modulation in a Switched Capacitor Transmitter

Another aspect of some embodiments of the present disclosure may include a transmitter comprising a switched capacitor transmitter circuit comprising a plurality of capacitors switchably coupled between a power supply terminal and a reference voltage terminal and driven by a thermometer encoder. A thermometer encoder circuit may receive a Cartesian modulated signal from digital TX Cartesian Modulator, for example, and produce a positive thermo encoded signal and a negative thermo encoded signal, for example. Cartesian modulated signals may include in-phase (I) and quadrature phase (Q) components that are combined digitally into one digital data signal or separate in-phase (I) and quadrature phase (Q) components combined in a power amplifier, for example. Accordingly, in one embodiment, a thermometer encoder may receive a Cartesian modulated signal as a digital data signal including both I and Q components. In another embodiment, a thermometer encoder may receive an in-phase (I) signal and a quadrature phase (Q) signal and produce a positive thermo encoded I signal, negative thermo encoded I signal, positive thermo encoded Q signal and negative thermo encoded Q signal, for example. Features and advantages of the present disclosure may include bit lines of the positive thermo-encoded signal coupled to control particular capacitors of the plurality of capacitors, and bit lines of the negative thermo-encoded signal coupled to control particular capacitors of the plurality of capacitors in a reversed bit order relative to the bit lines of the positive encoded signal. Bit order reversal may be used for either digital cartesian upconversion or for I and Q power combining, for example. In another embodiment described below, a Cartesian modulated signal is pseudo-differentially encoded prior to thermo encoding.

Figure 14A:
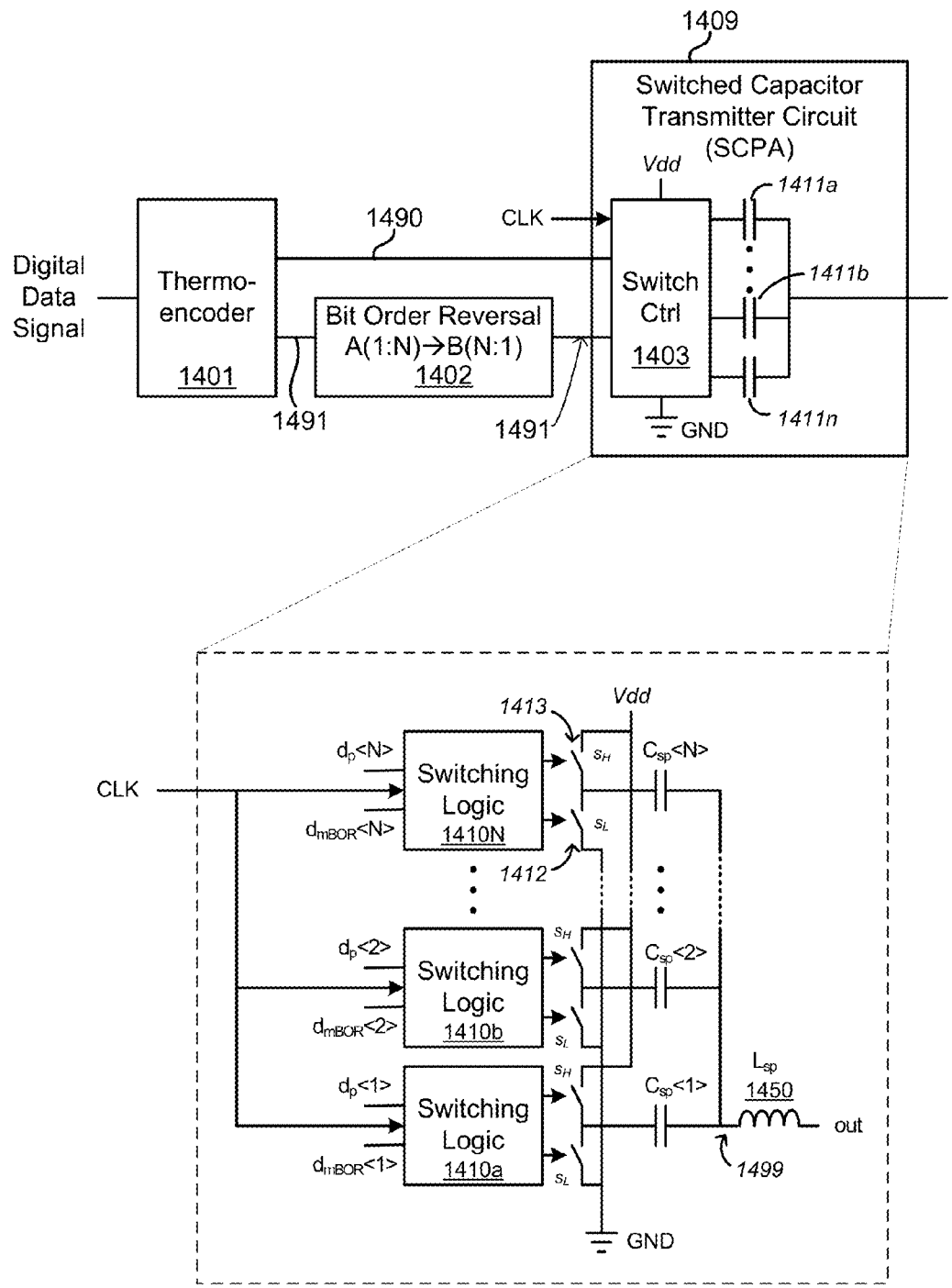
FIG. 14A shows a switched capacitor transmitter with thermometer encoding according to an embodiment.

For example, FIG. 14A shows a switched capacitor transmitter with thermometer encoding according to an embodiment. In this example, a Cartesian modulated digital data signal is received by a thermometer encoder ("thermo-encoder") 1401. The output of the thermo-encoder is a positive thermo-encoded signal on line 1490 (e.g., dp<N>) and a negative thermo-encoded signal on line 1491 (e.g., dm<N>). The negative thermo-encoded signal is bit order reversed at 1402, which may produce a bit order reversed signal on line 1492 (e.g., dmBOR<N>). Both the positive thermo-encoded signal on line 1490 and the bit order reversed negative thermo-encoded signal on line 1492 are applied to the switch control circuit 1403 for controlling particular capacitors 1411*a-n* in the SCPA 1409. An example thermometer encoder for a 3-bit to 8-level signal is shown below in Table 4A (positive output) and Table 4B (negative output). An example thermometer encoder with relative bit-order reversal between inverted outputs is illustrated below in Table 5B.

FIG. 14A further illustrates an example of SCPA. The bit lines of the positive thermo-encoded signal 1490, dp<1:N>, may comprise N positive thermo-encoded bits, and the bit lines of the negative thermo-encoded signal 1491, dm<1:N>, may comprise N bits that are the inverse of the N positive thermo-encoded bits. In this example, the bits are distributed as follows. An nth bit of the positive thermo-encoded signal (e.g., dp<1> or dp<N>) is coupled to control an nth capacitor of the plurality of capacitors (e.g., Csp<N>), where n is less than or equal to N. Additionally, the negative thermo-encoded bits are bit order reversed so that an nth bit of the negative thermo-encoded signal, dm<n>, is coupled to control an N-(n−1)th capacitor of the plurality of capacitors (e.g., dm<1> controls Csp<N> and dm<N> controls Csp<1>).

In this example, the output of thermo-encoder 1401 is coupled to N switching logic circuits 1410*a*-N to control switches sH and sL coupled to the plurality of capacitors Csp<1:N>. Switching logic circuits 1410*a*-N may receive particular bit lines of the positive thermo-encoded signal and particular bit lines of the negative thermo-encoded signal in the reverse bit order, dmBOR<n>, for example. In this example, each capacitor Csp comprises a first terminal and a second terminal, where the first terminal is coupled to the power supply terminal Vdd through a first switch, sH, and the first terminal is coupled to the reference voltage terminal, here ground, through a second switch, sL. The first switch and the second switch are controlled by a particular switching logic circuit. For example, switching logic circuit 1410*a* controls switches sH and sL coupled to capacitor Csp<1>. The second terminal of each capacitor in the plurality of capacitors is coupled to a node 1499. In this example, node 1499 is coupled through an inductor 1450 to the SCPA output, "out."

Embodiments of the present disclosure may further include modulation of the signal being transmitted. For example, each switching logic circuit 1410*a*-N may combine the positive thermo-encoded signal, dp, with a clock signal, CLK, having a frequency at least two times the frequency of the positive thermo-encoded signal. Accordingly, the digital data signal is modulated (or upconverted) by the clock signal. Similarly, each switching logic circuit may combine the bit order reversed (BOR) negative thermo-encoded signal, dmBOR, with an inverse of the clock signal having a frequency least two times the frequency of the BOR negative thermo-encoded signal. As described in more detail below, the modulated (or "chopped") signals may be combined to control switches for a particular capacitor (see e.g., FIGS. 19A-B and 23 below).

In some embodiments described in more detail below, the circuit may include a delta-sigma modulator having an input to receive a Cartesian modulated digital data signal, for example, comprising separate in-phase (I) signal and the quadrature (Q) signal and an output coupled to a thermometer encoder circuit in an SCPA, for example, where the thermometer encoder circuit receives the in-phase (I) signal and quadrature (Q) signal in delta-sigma modulated form. Additional details, aspects, and advantages of certain embodiments are illustrated by the following example implementation details.

Figure 14B:
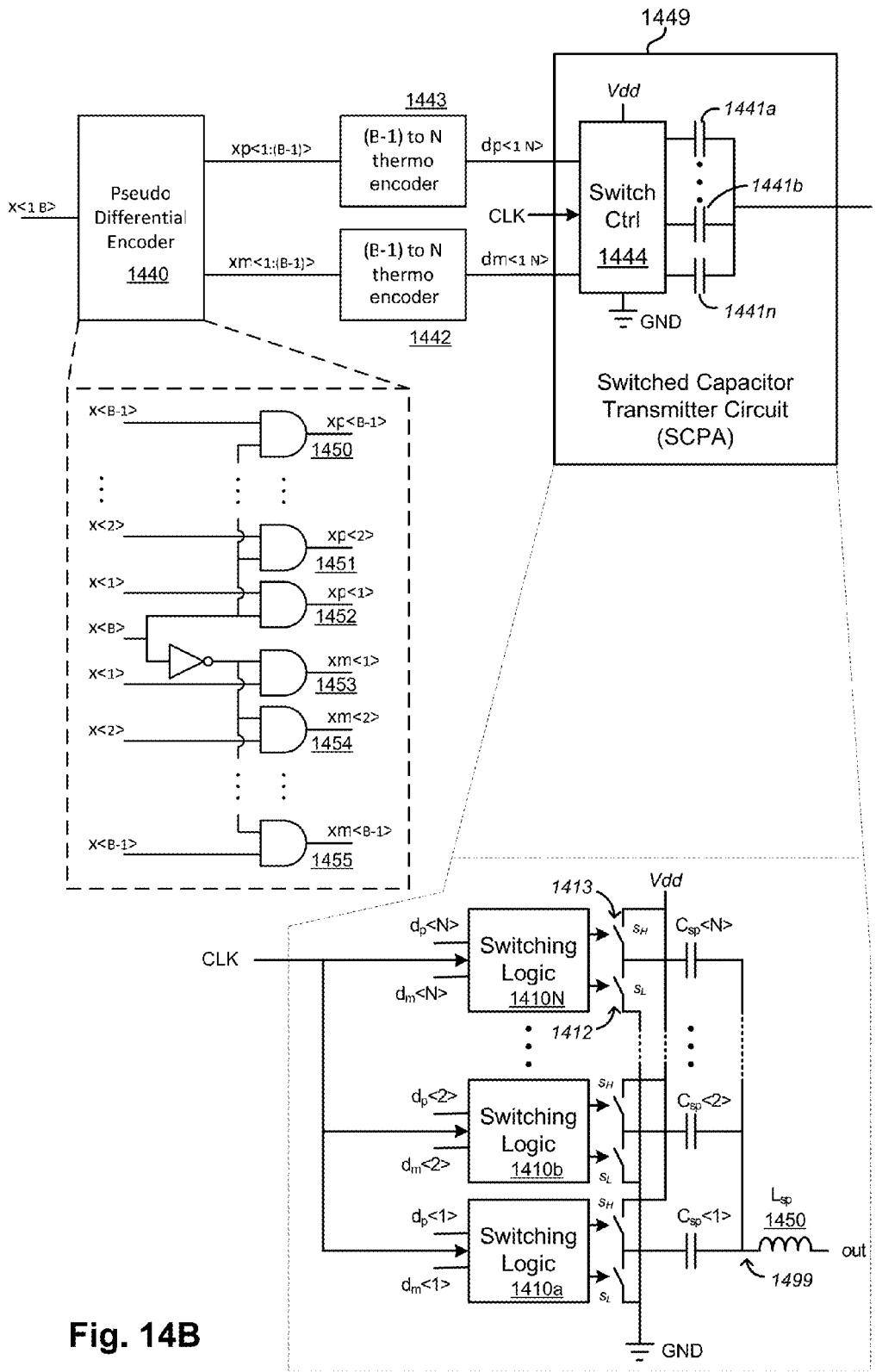
FIG. 14B shows a switched capacitor transmitter with pseudo-differential encoding according to another embodiment.

FIG. 14B illustrates an example switched capacitor transmitter according to another embodiment. In this example, a Cartesian modulated digital data signal may be encoded with a pseudo-differential encoder 1440 prior to thermometer encoding, for example. Accordingly, example embodiments may further comprise a pseudo differential encoder 1440. In this example, pseudo-differential encoder 1440 receives a digital data signal (e.g., x<1:B>) and produces a positive pseudo-differential (PD) encoded output signal (e.g., xp<1:(B−1)>) and a negative pseudo-differential (PD) encoded output signal (e.g., xm<1:(B−1)>). Note that in this example the pseudo-differential encoding reduces the bit length by 1. Positive PD encoded signal, xp, is received by a first thermometer encoder circuit 1443, which produces a positive thermo encoded output signal (e.g., dp<1:N>). Similarly, negative PD encoded signal, xm, is received by a second thermometer encoder circuit 1442, which produces a negative thermo encoded output signal (e.g., dm<1:N>). The positive and negative thermo encoded output signals, dp<1:N> and dm<1:N>, are coupled to inputs of switch control circuit to control switching capacitors 1441a-n in SCPA 1449, which may work substantially as described above for SCPA 1409.

FIG. 14B further illustrates another example of an SCPA receiving drive signals. In this example, bit lines dp<1:N> and dm<1:N> drive similar switching logic blocks 1410, switches 1413, and particular capacitors as described in FIG. 14A. However, in this example, which includes a pseudo-differential encoder 1440, the bit order may or may not be reversed. Accordingly, pseudo-differential encoding followed by thermo encoding may provide advantageous results even without bit order reversal, and in some embodiments, pseudo-differential encoding followed by thermo encoding may optionally include bit order reversal for improved performance in some applications.

Example Switched Capacitor Cartesian Power Amplifier

Features and advantages of another aspect of the present disclosure include a digital transmitter Switched Capacitor Cartesian Power Amplifier (SCCPA) including a switched capacitor PA (SCPA) Cartesian modulator digital to analog converter (DAC), which may achieve overall maximum efficiency $\eta$. Particular examples disclosed herein use a RF sample data rate of Fs=3 GHz quadrature data into multi-tap direct I & Q modulated SCPAs with carrier frequency $F_c=2F_s=6$ GHz and analog quadrature combining (a.k.a. Direct IQ). However, it is to be understood that the example implementation is merely exemplary of the advantages of the techniques described below.

Certain embodiments may have the following features and advantages: 1) Increasing the number of taps achieves efficiency enhancement due to a $\sim(\Sigma V_{DD})^2/\Sigma(V_{DD}^2)$ power gain unique to SCPA. 2) There is no inherent impact on efficiency from quadrature combining (assuming ideal passive combiner efficiency). 3) The main impact on efficiency of an SCCPA vs. the original Polar SCPA is from switching loss due to the mid-code average of Cartesian waveforms. However, this can be largely mitigated by pseudo-differential or bit-order reversed thermometer encoding (BOR).

The average dynamic SCPA efficiency for sinewaves (e.g. static amplitude) at peak and −6 dB-6 dB backoff summarized in Table 1 show the significant improvement of multi-tap combining and pseudo-differential/BOR vs. conventional differential encoding.

TABLE 1

Cartesian SCPA ideal average dynamic efficiency for sinewaves vs. Ntaps and encoding type

| Encoding | $N_{taps}$ | $\eta_{ideal}$(peak) | $\eta_{ideal}$(peak − 6 dB) |
| --- | --- | --- | --- |
| Differential Polar | 1 | 100% | 31.0% |
| Differential Polar | 2 | 100% | 47.4% |
| Differential Polar | 4 | 100% | 64.3% |
| Differential Cartesian | 1 | 32.7% | 6.5% |
| Differential Cartesian | 2 | 49.3% | 12.1% |
| Differential Cartesian | 4 | 66.1% | 21.7% |
| Pseudo-Diff Cartesian | 1 | 65.7% | 21.9% |
| Pseudo-Diff Cartesian | 2 | 79.3% | 36.0% |
| Pseudo-Diff Cartesian | 4 | 88.5% | 52.9.0% |
| Differential BOR Cartesian | 1 | 62.3% | 23.5% |
| Differential BOR Cartesian | 2 | 76.8% | 38.1% |
| Differential BOB Cartesian | 4 | 86.8% | 55.1% |

Using bit-order reversed thermometer encoding (BOR) we can get close to Polar SCPA performance, but without the drawbacks of Polar SCPA (phase vs. amplitude tracking error) or Pseudo-differential (noise and carrier feed-thru due to code-dependent common-mode). While ideal dynamic sinewave SCCPA efficiency provides an upper bound for architectural comparisons, for overall efficiency we have to incorporate additional losses due to the passive combiner, switching logic, drivers, and switches etc. in order to determine the ultimate realizable SCCPA efficiency. With an example 6 GHz 8-tap (4-tap each I&Q) combiner design passive efficiency $\eta_{comb}$=0.47 and switching loss factor, $\beta_{switch}$=0.85, the peak and peak–6 dB dynamic sinewave efficiencies are 42.3% and 30%, respectively. Currently, the passive combiner has a significant impact on overall efficiency. Finally, in one example implementation, when driven into as deep saturation as possible, while meeting Tx emissions requirements the overall efficiency of 20 MHz, {100RB QPSK, QAM-16, QAM-64} modulated waveforms including these losses are {33.5%, 35.6%, 33.3%}, respectively while achieving average powers of {17.0 dBm, 17.9 dBm, 17.0 dBm} from a 1 volt DC supply.

Static SCPA Efficiency Enhancement Using Multi-Tap Voltage Combining

In this section we start by summarizing the operation of a conventional polar modulated SCPA and extend it to a multiple tap combiner version which enhances the efficiency.

An SCPA may use a polar modulated waveform in which the amplitude component is generated by switching a subset of N capacitors between Vdd and Vgnd as shown above in FIG. 3, for example. When the amplitude code from encoder 351 changes, a different subset of capacitors are switched. At the peak amplitude, all N N capacitors are switched and the PA is operating in Class-D with a theoretical 100% efficiency. However, at lower amplitudes power is lost when charging the shunt-capacitors.

The SCPA load connected to the output (top-plate of the switching caps) is assumed to present relatively high impedance at harmonics of the switching frequency. Therefore the current to the load does not change instantaneously and the voltage at that node is determined by the charge equilibrium between the capacitors.

In the case of polar modulated waveform, the capacitors are charged then discharged between codes and so it allows the use of a Thevenin equivalent circuit model to calculate, for a given amplitude code, n, total switching capacitance, C, and N units of switching capacitance, the switched capacitor output voltage, $V_{Cp}(n)$; SCPA output voltage, $V_{out}(n)$; SCPA output power, $P_{out}(n)$; dynamic switching power, $P_{sc}(n)$; and efficiency (ideal), $\eta_{ideal}(n)$.

If the code n is static then the output is a fixed-amplitude square wave with a Fourier series amplitude component, $2/\pi$, at the carrier frequency, $f_c$, which is the same as the switching frequency. The equations are:

$$V_{Cp}(n) = \frac{n}{N} V_{dd} \quad (1)$$

$$V_{out}(n) = \frac{2}{\pi}\left(\frac{n}{N}\right) V_{dd} \quad (2)$$

$$P_{out}(n) = \frac{2}{\pi^2}\left(\frac{n}{N}\right)^2 \frac{V_{dd}^2}{R_L} \quad (3)$$

$$C_{in}(n) = \frac{n(N-n)}{N^2} C \quad (4)$$

$$P_{sc}(n) = f_c C_{in} V_{dd}^2 = \frac{n(N-n)}{N^2} f_c C V_{DD}^2 \quad (5)$$

$$\eta_{ideal\_polar}(n) = \frac{P_{out}(n)}{P_{out}(n) + P_{sc}(n)} = \frac{1}{1 + n(N-n)R_L \frac{\pi^2}{2} f_c C} \quad (6)$$

Now, consider a multiple-tap SCPA with ideal voltage combining. The SCPA output power, P_out (n) and switching power loss, P_sc (n), versus code, n, and number of taps, N_tap, are $$P_{out}(n, N_{taps}) = \sum_{i=1}^{N_{tap}} V_{Cp_i}(n)^2 = N_{taps}^2 \frac{2}{\pi^2}\left(\frac{n}{N}\right)^2 \frac{V_{DD}^2}{R_L} \quad (7)$$

$$P_{sc}(n, N_{taps}) = \sum_{i=1}^{N_{tap}} P_{sc_i}(n) = N_{taps} f_c \frac{n(N-n)}{N^2} C V_{DD}^2 \quad (8)$$

Using these we can find the ideal static efficiency (vs. n) to be $$\eta_{ideal\_polar}(n, N_{taps}) \frac{1}{1 + \frac{1}{N_{taps}}\left[\frac{(N-n)}{n}\right] \frac{f_c R_L C \pi^2}{2}} \quad (9)$$

This shows that for a given $f_c$, C and $R_L$, the switching loss component of the ideal static efficiency is reduced by increasing the number of taps, with a corresponding significant enhancement in ideal static efficiency at lesser peak amplitudes code values, n, as was shown in FIG. 6B and compared to ideal Class-B and all VDD normalized to the same peak output power.

Polar Vs. Cartesian Modulated Waveforms

From eq (5) it can be seen that the shunt capacitor switching loss, $P_{sc}(n)$, is parabolic vs. code n, with a peak at n=N/2. This is significant because, while a polar modulated waveform typically has a positive amplitude component (0, $V_{peak}$), a Cartesian modulated waveforms on the other hand must have codes for each I and Q channel that convey not only amplitude, but also phase. Therefore, the Cartesian waveform coding contains a peak-peak signed waveform ($-V_{peak}$, $+V_{peak}$) within n∈{0, 1, ..., N} whose average will be N/2 (e.g. at the value of maximum switching loss).

Figure 15A:
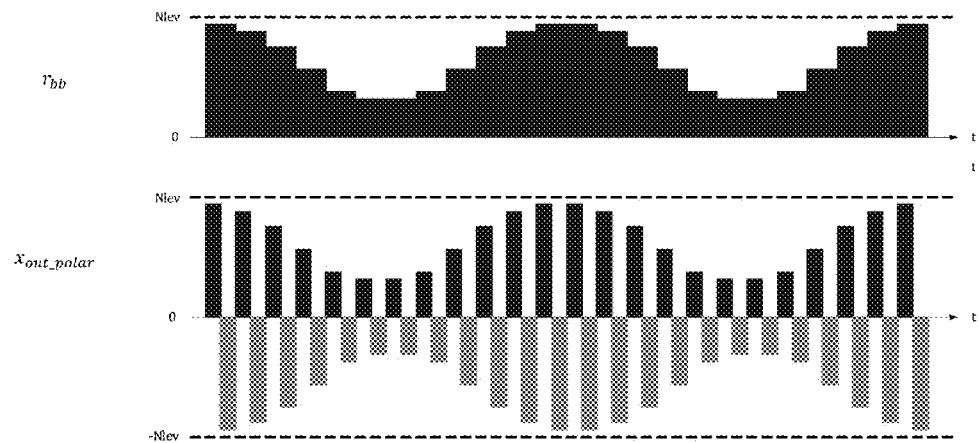
FIG. 15A shows a polar baseband amplitude waveform and RF output.
Figure 15B:
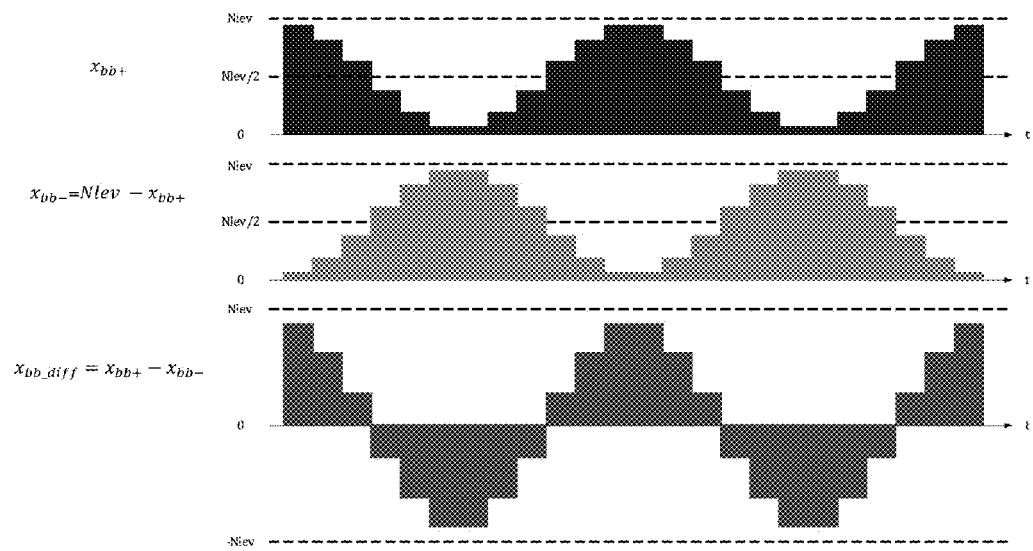
FIG. 15B shows a baseband waveform for Cartesian modulation.
Figure 15C:
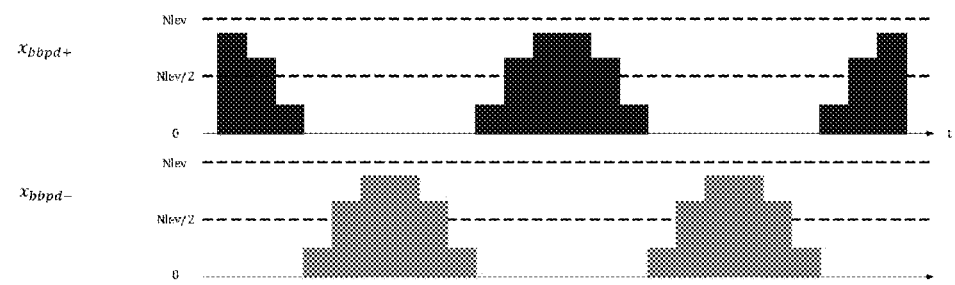
FIG. 15C shows a pseudo-differential implementation of a baseband waveform.
Figure 15D:
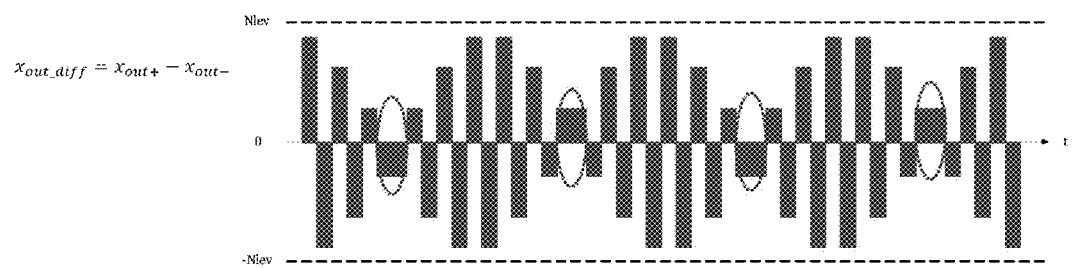
FIG. 15D shows a differential RF output for Cartesian modulation waveform.

These can be visualized in the following waveforms FIGS. 15A-D. FIG. 15A shows a polar baseband amplitude (0, $+V_{peak}$) waveform and RF output (amplitude only—phase not shown). FIG. 15B shows a baseband (-V_peak, +V_peak) waveform for Cartesian modulation (only 1-channel shown, could be either I or Q). FIG. 15C shows a pseudo-differential implementation of (-V_peak, +V_peak) baseband waveform. FIG. 15D shows a differential RF output for Cartesian modulation (-V_peak,+V_peak) waveform.

The waveforms in FIGS. 15A-D can provide some useful insights. For example, even if the ($-V_{peak}$, $+V_{peak}$) encoded waveform for Cartesian Modulation, shown in FIG. 15B, is highly compressed (e.g. pushed deep into saturation) in order to have more codes near the peak efficiency at n=N, then it will still swing around a bias offset at N/2. Thus the efficiency improvement may be buried in the bias loss and thus could essentially represents a waveform efficiency similar to Class A bias.

On the other hand, the (0, $V_{peak}$) amplitude waveform for polar modulation shown in FIG. 15A does not have this bias. Accordingly, certain embodiments may benefit from pseudo-differential encoding. Pseudo-differential is a differential signal where positive and negative sides of signal do not swing in a perfectly differential manner. A Pseudo-differential version of the Cartesian baseband modulation waveform is shown in FIG. 15C, which shows the effect of removing the N/2 bias, yet it generates a differential output which is identical to the ($-V_{peak}$, $+V_{peak}$) version. However, pseudo-differential encoding yields a (modulation) code-dependent common mode signal component which may cause problems (Rx band noise and/or carrier feed-thru) depending on the amount of imbalance in the differential combining.

The carrier modulated differential RF output Cartesian modulation waveform shown in FIG. 15D may be obtained, for example, by chopping (i.e., modulating) the baseband waveform with a (+1,-1) square wave of (at least) twice the frequency as that the baseband. It shows that, effectively, the sign of the baseband waveform (it's level relative to N/2) which may be the MSB of the binary encoded waveform inverts the phase of the carrier. This means that the waveform is non-return-to-zero (NRZ) and may be sensitive to pulse width error when implemented with true differential or pseudo-differential waveforms, for example.

Dynamic Charge-Based SCPA Circuit Analysis for Cartesian Modulated Waveforms

The ideal static efficiency models of eq (6) and (9) hold for polar modulated amplitude waveforms which return to zero every cycle and thus all the capacitors switched to the low state. However, as shown in the previous section, this is not the general case for Cartesian modulated waveforms which convey both amplitude and phase. In order to be able to compare various waveform codings we need to consider circuit state transitions in which some of the capacitors switch from low to high while some switch from high to low and some capacitors remain in the low or high state during the transition. For example, in binary and conventional thermometer encoding most of the transitions involve complementary switching in which some of the capacitors switch from low to high while the remainders switch from high to low. Therefore, in this section we develop a charge-based model for SCPA dynamic supply current based on the four terminal 2-state switched capacitor circuit diagram shown FIG. 16, which shows a four terminal, 2-state SCPA circuit model for charge-based dynamic supply current.

In this model, $C_{LH}$ represents the total switching capacitance whose bottom plate switches from the low supply, $V_L$, in state $s_1$ to the high supply $V_H$ in state $s_2$. Similarly, $C_{HL}$ represents the total capacitance switching from high to low during the transition from state $s_1$ to state $s_2$. $C_{LL}$ represents the total shunt capacitance whose bottom plate has already been switched to the low supply during a previous code state transition and remain there, whereas $C_{HH}$ similarly represents the total shunt capacitance previously switched to the high supply and remaining there.

When $C_{LH}$ capacitors are switching from low to high, current will be demanded from the high supply to charge the shunt capacitors through the bottom plate of $C_{LH}$. However, as the voltage $V_{CP}$ on the top plate of the capacitors rises (e.g. when $C_{LH} > C_{HL}$), charge is forced out of the bottom plate of $C_{HH}$. Thus part of the charge through $C_{LH}$ during the transition does not come from the supply but rather is shared from the bottom plate of $C_{HH}$. In a conventional polar modulated SCPA, this never occurs because all the capacitors are switched back to ground every cycle. Similarly, when switched from the high supply to the low supply then $V_{CP(S_2)}$ will be lower than $V_{CP(S_1)}$ and $\Delta Q_{HH}$ will be negative, meaning charge will be drawn from the supply for high to low transitions.

In the following, we calculate the charges on each of the capacitors from the voltages at charge equilibrium for both states of the code transition and tally the changes for the capacitors connected to the supply in order to get the dynamic supply current consumption.

Setting $V_L=0$, charge equilibrium requires $$Q_{LL\{s_1\}}+Q_{LH\{s_1\}}+Q_{LH\{s_1\}}+Q_{HH\{s_1\}}=0 \qquad (10)$$

$$Q_{LL\{s_2\}}+Q_{LH\{s_2\}}+Q_{LH\{s_2\}}+Q_{HH\{s_2\}}=0 \qquad (11)$$

where, $$Q_{LL\{s_1\}}=(V_{CP\{s_1\}}-0)C_{LL} \qquad (12)$$

$$Q_{LH\{s_1\}}=(V_{CP\{s_1\}}-0)C_{LH} \qquad (13)$$

$$Q_{HL\{s_1\}}=(V_{CP\{s_1\}}-0)C_{HL} \qquad (14)$$

$$Q_{HH\{s_1\}}=(V_{CP\{s_1\}}-0)C_{HH} \qquad (15)$$

and, $$Q_{LL\{s_2\}}=(V_{CP\{s_2\}}-0)C_{LL} \qquad (16)$$

$$Q_{LH\{s_2\}}=(V_{CP\{s_2\}}-0)C_{LH} \qquad (17)$$

$$Q_{HL\{s_2\}}=(V_{CP\{s_2\}}-V_H)C_{HL} \qquad (18)$$

$$Q_{HH\{s_2\}}=(V_{CP\{s_2\}}-V_H)C_{HH} \qquad (19)$$

Plugging eq(12)-(15) into (10) and solving for $V_{CP(S_1)}$ yields $$V_{CP\{s_1\}} = V_H\left(\frac{C_{HL}+C_{HH}}{C_{LL}+C_{LH}+C_{HL}+C_{HH}}\right) \qquad (20)$$

Similarly, using eq(16)-(19) into (11) after the transition to state $s_2$, we'll have $$V_{CP\{s_2\}} = V_H\left(\frac{C_{LH}+C_{HH}}{C_{LL}+C_{LH}+C_{HL}+C_{HH}}\right) \qquad (21)$$

As a check, note that for the conventional SCPA with polar modulation, the capacitors are always all switched low every cycle and so $C_{HH}=C_{HL}=0$. In that case for any of the low to high transitions, we'll have $$V_{CP\{s_1\}} = 0 \text{ and } V_{CP\{s_2\}} = V_H\left(\frac{C_{LH}}{C_{LH}+C_{LL}}\right)$$

which, for $$V_H = V_{DD}, C_{LH} = nC \text{ and } (C_{LM}+C_{LL}) = NC,$$

yields $V_{CP\{s_2\}} = V_{DD}\frac{n}{N}$ and this agrees with eq (5).

Now, for the change in charge on the capacitors, $C_{LH}$ and $C_{HH}$, which are connecting (and thus charging) from the supply, we'll have $$\Delta Q_{LH} = Q_{LH\{s_2\}} - Q_{LH\{s_1\}} \qquad (22)$$
$$= (V_{CP\{s_2\}} - V_H - V_{CP\{s_1\}})C_{LH}$$
$$= -V_H\left(\frac{2C_{HL}+C_{LL}+C_{HH}}{C_{LL}+C_{LH}+C_{HL}+C_{HL}}\right)C_{LH}$$

$$\Delta Q_{HH} = Q_{HH\{s_2\}} - Q_{HH\{s_1\}} \qquad (23)$$
$$= (V_{CP\{s_2\}} - V_{CP\{s_1\}})C_{HH}$$
$$= V_H\left(\frac{C_{LH}-C_{HL}}{C_{LL}+C_{LH}+C_{HL}+C_{HL}}\right)C_{HH}$$

And the net charge from the power supply, when switching from any state $s_1$ to state $s_2$ is $\Delta Q_{LH}+\Delta Q_{HH}$.

Now from eq(22) we can see that having more capacitors $C_{HH}$ remaining in the high position which reduces those capacitors $C_{HL}$ and $C_{LL}$ switching from high to low and remaining low, respectively, reduces the dynamic supply current for the caps, $C_{LH}$ switching low to high.

In the case of Polar modulation the code goes to zero every other cycle, therefore all of the capacitors return to zero during which none are connecting high. As such, the $2C_{HL}$ term in eq(22) is always cancelled out by $C_{LH}=0$. This is also true for most of the code transitions for Pseudo-differential Cartesian modulated waveforms in which all the capacitors return to zero for most code transitions.

However, in conventional differential Cartesian modulation (which may be implemented with a simple XNOR of the clock and baseband data), during the chopping of a baseband symbol with the carrier clock, the number of $C_{HL}$ capacitors is simply the complement of the $C_{LH}$ which enhances the impact of the $2C_{HL}$ term in eq(22), thus drawing excess charge from the supply and degrading efficiency relative to the Polar modulation and pseudo-differential Cartesian modulation cases.

Next, eq(23) shows the effect of $C_{HH}$ capacitors either pushing charge back into the supply (to be shared with those capacitors switching low to high) when there is a net number of capacitors going low to high vs. pulling charge from the supply when there is a net number of capacitors going high to low.

Multi-Tap Direct IQ SCCPA Architecture

Figure 16:
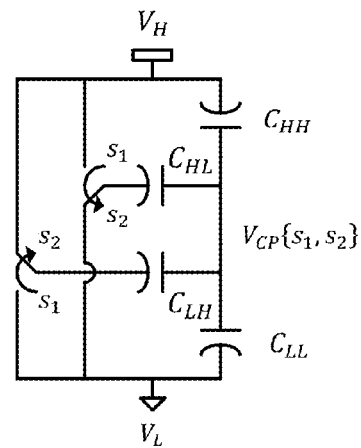
FIG. 16 shows a charge-based model for switched capacitor dynamic supply current based on a four terminal 2-state switched capacitor circuit.
Figure 17:
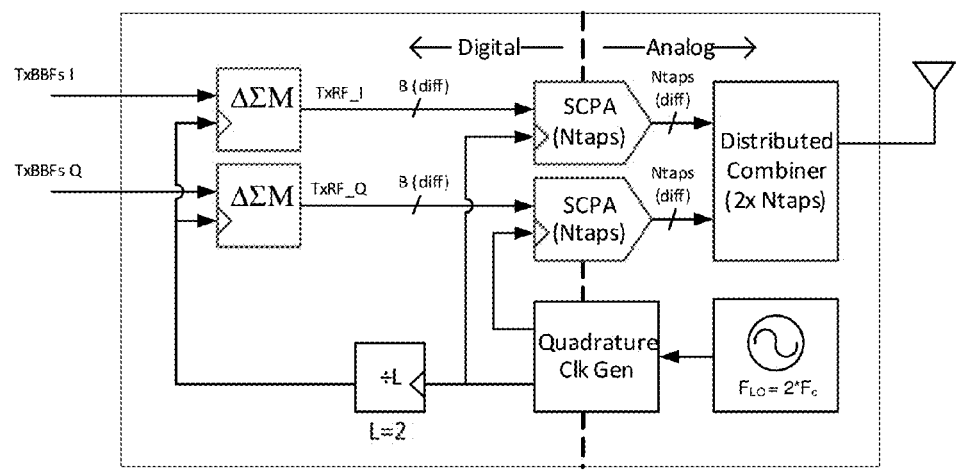
FIG. 17 shows an example Digital RF Tx Path with Direct IQ SCCPA.
Figure 18:
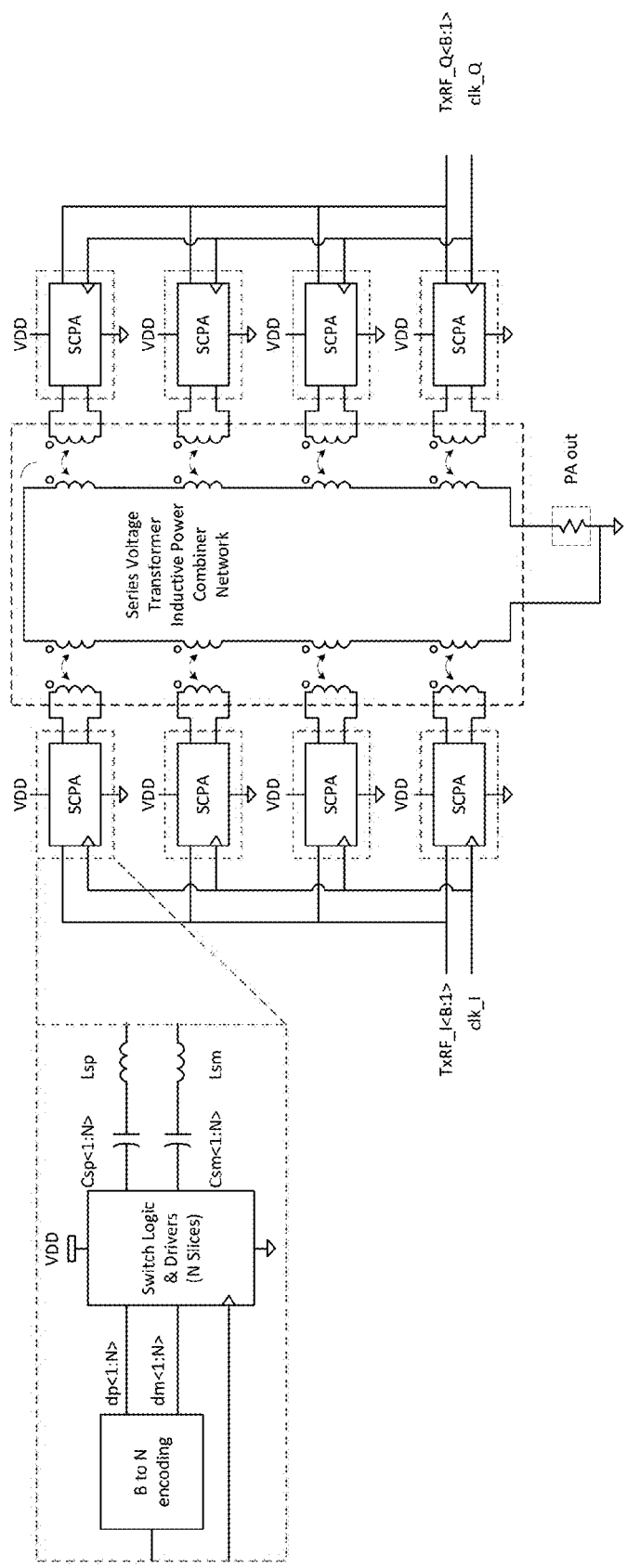
FIG. 18 shows an example Multi-tap Direct IQ SCCPA with series voltage transformer inductive power combiner network.
Figure 19A:
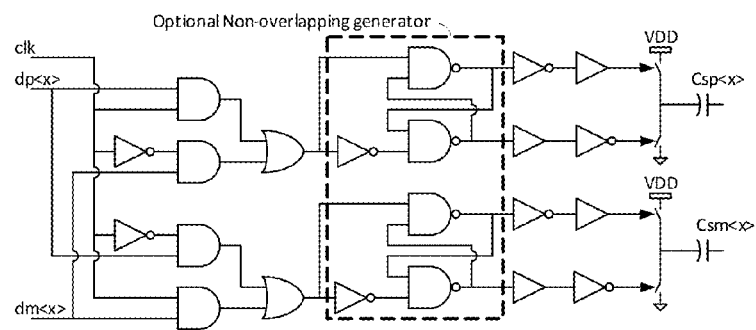
FIG. 19A shows an example SCPA switch logic and drivers according to one embodiment.
Figure 19B:
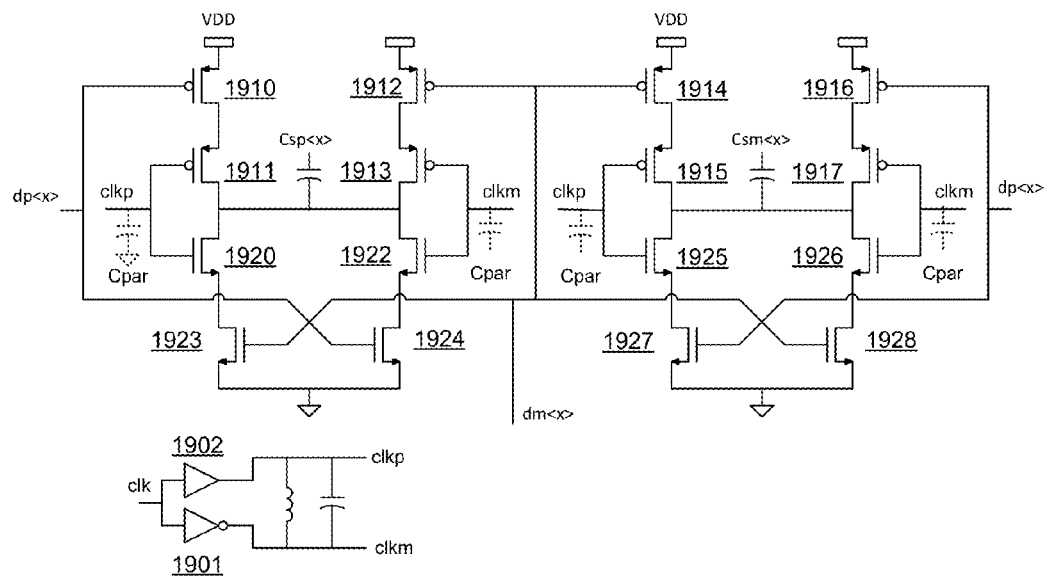
FIG. 19B shows another example SCPA switch logic and drives according to another embodiment.

Certain embodiments may include a Direct IQ SCCPA architecture. One example implementation of top-level digital RF signal path block diagrams with multi-tap direct IQ SCCPA including switching logic are shown in FIGS. 16-19. A charge-based model for SCPA dynamic supply current based on the four terminal 2-state switched capacitor circuit diagram is shown in FIG. 16. FIG. 17 shows an example Digital RF Tx Path with Direct IQ SCCPA. FIG. 18 shows an example Multi-tap Direct IQ SCCPA with series transformers voltage combiner. FIG. 19A shows an example SCPA Switch Logic and Drivers according to one embodiment. In this configuration the lower frequency dp and dm inputs effectively gate off the higher frequency clk prior to the higher power consuming switch driver stages, thus enabling effective encoding, such as bit order reversal or pseudo-differential, to have maximum effect on improving efficiency. FIG. 19B shows an example SCPA Logic and Drivers according to another embodiment. This configuration may be useful for high carrier frequencies, for example, which are beyond the maximum for full-swing static logic operation such as needed for the several series logic gate implementation of the previous embodiment. In this configuration, an inverter 1901 and buffer 1902 between the clk and clkp, clkm signals is not a static logic circuit but instead represent single-ended to differential sinewave amplifier driving a resonant load. Between the output switching capacitors, csp and csm and these differential clocks, clkp and clkm, there are only a single PMOS and NMOS transistors, whos parasitic capacitances can be included in the resonant load of the inverter-buffer for maximizing power efficiency. As shown in FIG. 19B, capacitors Csp and Csm are coupled between VDD and ground by the action of PMOS switching transistors 1910-1917 and NMOS switching transistors 1920-1927 under control of dp, dm, and clk.

Embodiments of the present disclosure may include three types of B-to-N encoding. The first comprises simple binary weighted and/or thermometer encoding with inverting outputs. In this case, the switching logic reduces to a simple XNOR operation. In the second encoding implementation, the input data is first converted to pseudo-differential before binary or thermometer encoding. Finally, embodiments may use another encoding in which there is a relative bit-order reversal (BOR) between the thermometer encoder inverting outputs, which leads to significant improvement in overall dynamic switched capacitor efficiency.

Direct I&Q Modulator Top Level Description

The example direct IQ SCCPA in FIG. 17 has quadrature TxBB baseband data coming in at a rate equal to $f_c/L$, where $f_c$ is both the carrier frequency as well as the clock frequency of the SCCPA. In this example, the TxBB data has been already upsampled and CIC interpolation-filtered to the $f_c/L$ sample rate.

TxBB I and Q data are processed with a bandpass delta sigma modulator $\Delta\Sigma M$ to reduce the {bit-widths, number of quantization levels} from {N=16, $2^{16}$} to (B=5, 29. The $\Delta\Sigma M$ may be optional, but its reduced output bit-width supports one example of bit-order reversed thermometer encoding which, can improve the SSCPA efficiency by reducing switching capacitor loss (e.g., by ~50%) compared to binary encoding or conventional thermometer encoding with conventional XNOR modulator. Furthermore, the resulting fewer number of unit elements makes dynamic calibration more practical, which may be needed to reduce NRZ distortion. The $\Delta\Sigma M$ may incorporate noise transfer function (NTF) zeros in concurrently operating Rx bands for RF co-existence scenarios. Within the bandpass IQ SCPA, the baseband data may be further upsampled by L during the direct carrier modulation. Alternatively, the baseband data may be further upconverted to the carrier frequency during the direct carrier modulation. As will be shown below, either the upsampling or the upconversion can result in the same effective transfer function Finally, multiple SCPAs per I and Q channel may be summed together in the distributed transformer voltage combiner as described above, for example.

Direct I&Q Modulator SCPA Efficiency Including Ideal Quadrature Combining

Because the two I and Q SCPA outputs have a quadrature phase relationship, they sum in power rather than voltage. Therefore, it would be reasonable to assume that there would be a loss in efficiency. However, this is not the case for Cartesian SCPA as the following shows.

First, consider the ideal $\eta\_SCPA$ of a single channel SCPA $$\eta_{SCPA}(\text{average}) = \frac{\langle P_{out}\rangle}{\langle P_{supply}\rangle} = \frac{\langle V_{out}^2/R_L\rangle}{\langle V_{out}^2/R_L\rangle + \langle P_{sc}\rangle} \quad (24)$$

where the $\langle\cdot\rangle$ operator denotes a time-average. Now, assuming that for each I and Q channel their average output powers and switching power are the same as for a single SCPA, e.g., $$\langle P_{outI}\rangle = \langle V_{outI}^2/R_L\rangle = \langle P_{outQ}\rangle = \langle V_{outQ}^2/R_L\rangle = \langle V_{out}^2/R_L\rangle, \quad (25)$$

$$\text{and } \langle P_{scI}\rangle = \langle P_{scQ}\rangle = \langle P_{sc}\rangle \quad (26)$$

then for the case of two channels with quadrature phase we have $$\begin{aligned}\eta_{IQSCPA}(\text{average}) &= \frac{(P_{outI} + P_{outQ})}{(P_{supplyI} + P_{supplyQ})} \quad (27)\\ &= \frac{(P_{outI} + P_{outQ})}{(P_{outI} + P_{outQ}) + (P_{scI} + P_{scQ})}\\ &= \frac{(V_{outI}^2/RL) + (V_{outQ}^2/RL)}{(V_{outI}^2/RL) + (V_{outQ}^2/RL) + (P_{scI} + P_{scQ})}\\ &= \frac{2(V_{out}^2/RL)}{2(V_{out}^2/RL) + 2(P_{sc})}\\ &= \eta_{SCPA}(\text{average})\end{aligned}$$

Direct I&Q Modulator Transfer Function

In this section we develop the transfer function of an example direct I&Q modulator so we can derive the ideal SCCPA efficiency model. We look at the basics of generating the Tx signal using a pulse code sequence in which the Tx carrier frequency is an integer multiple of the baseband data sample rate. This will serve as a general baseline for describing the development of some example SCPA Tx implementations using particular binary and thermometer encodings in the section which follows. In the context of Cartesian SCPA (SCCPA) the implementation would be for either one of the I&Q quadrature channels.

We start by synthesizing a FIR based linear model to attenuate images generated during the upsampling by L. Then we show that this is functionally identical to a simple modulator chopped at the carrier frequency, which is the conventional implementation. The modulation produces images at multiples of $F_c/L$. However, these images are notched by an inherent FIR operation in the modulator, which is described using the following example with L=2.

For now, assume that the baseband data, x[n], is a single bit of a multi-bit DAC and its sample rate is half of the carrier frequency, $F_{bb}=F_c/2$. For proper signal-energy processing the data is assumed to be bipolar. A bipolar signal is a signal that swings equally around zero, for example, $x_{bb} \in (1,-1)$. In contrast, a unary signal is a signal that swings from zero to a peak value, for example $x_n \in \{1,0\}$. The modulation process effectively upsamples the data to $2F_c$, which is represented by an $$\frac{F_c}{2} \to 2F_c$$

expander:

$$x_e = \{ \ldots, x_{bb_1}, 0, 0, 0, x_{bb_2}, 0, 0, 0, \ldots \} \quad (28)$$

which, in this example, oversamples sample the data by 4. This generates undesired sampling images at multiples of $F_c/2$. Therefore, prior to the output, we would like to process the signal with a FIR filter with coefficients, $\{+1,-1,+1,-1\}/4$, $$h_{FIR\_IQMOD}(z) = \frac{1 - z^{-1} + z^{-2} - z^{-3}}{4} \quad (29)$$

The length of the FIR as well as number of images are equal to the oversampling ratio.

Figure 20:
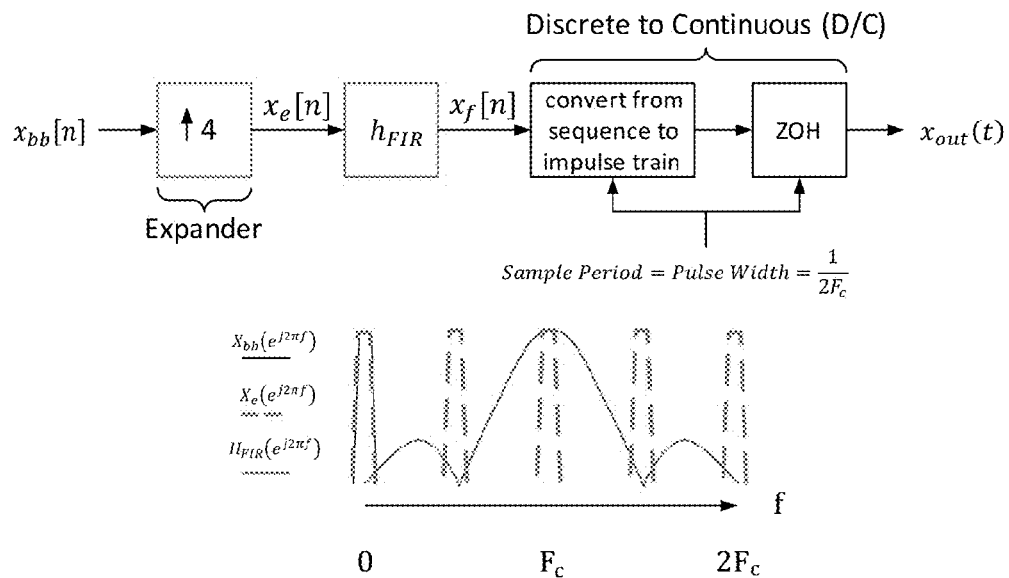
FIG. 20 shows an Impulse Domain Upconverter Signal Path with FIR.

A discrete-time to continuous-time converter with Zero-order hold (ZOH) completes a signal path shown in FIG. 20, which shows the Impulse Domain Upconverter Signal Path with FIR representing the signal processing along with its corresponding FIR magnitude response.

Figure 21:
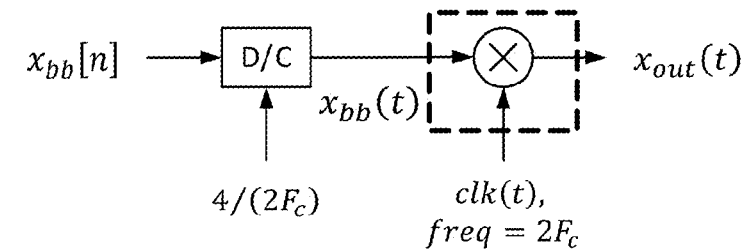
FIG. 21 showing a time-domain Tx path.
Figure 21:
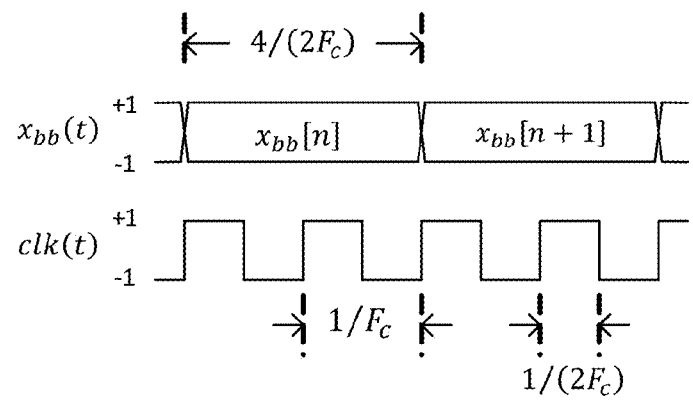

However, in practice it may not be necessary to use the expander and FIR blocks and instead use a simple XNOR modulator to implement the identical waveforms because the FIR has alternating coefficients and it length is equal to the expansion ratio, L. It therefore has an equivalent time-domain Tx upconverter path, shown in FIG. 21 showing a time-domain Tx path, where the bipolar data is first converted to the time domain and then processed with a bipolar clock (e.g. chopped) at the carrier frequency.

Figure 22:
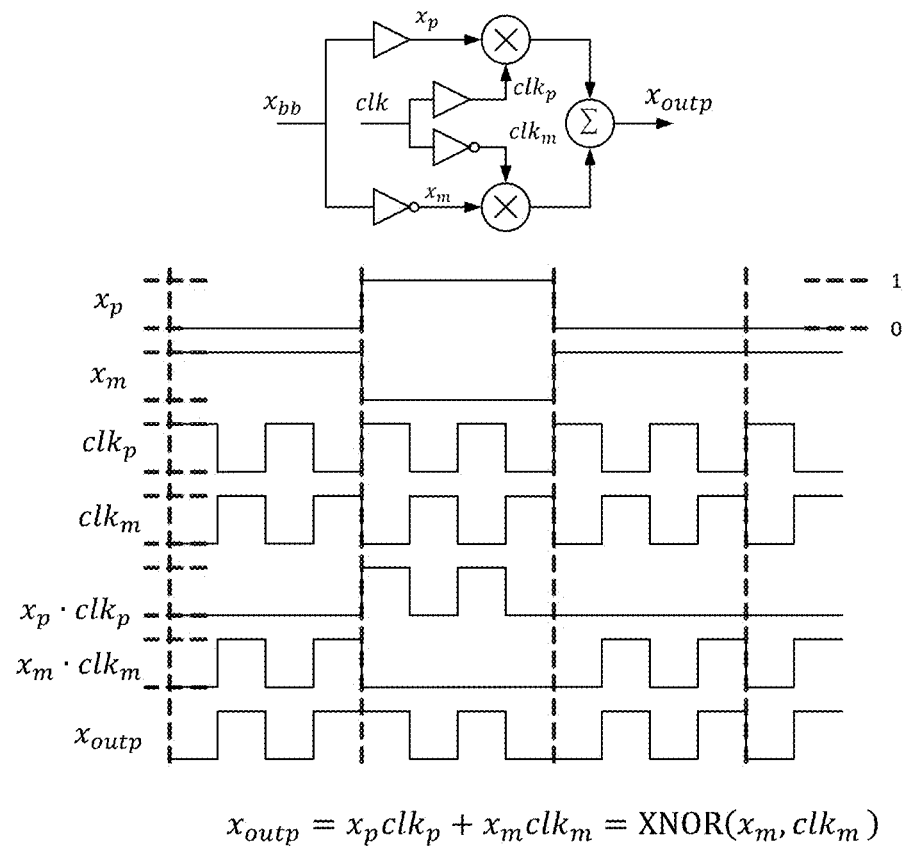
FIG. 22 shows a unipolar implementation of SCPA Tx path and waveforms.

For some digital logic hardware implementations we need to use unipolar data, e.g., $x_{bb}$, clk$\in \{1,0\}$. FIG. 22 shows a unipolar implementation of SCPA Tx path and waveforms. In the unipolar implementation, the positive and negative amplitude operations may be performed separately and summed. Because the data is unipolar and we're processing a digital representation of the signal energy (as opposed to doing arithmetic), the algebraic multiplication and summation can be replaced by AND and OR gates, respectively. Clearly, the overall operation is simply an XNOR and representative of conventional direct carrier modulation. However, it's useful to illustrate the signal path this way because, as illustrated in examples below, it may be desireable in some embodiments to have independent inputs for $x_p$ and $x_m$, instead of just being complementary and so the operation will no longer be a simple XNOR, yet the boolean operations still implement identical overall processing as the bipolar representation but enable up to ~50% reduction in switching capacitor power loss over the XNOR implementation.

The overall transfer function includes the FIR (modulator) and the ZOH responses, both evaluated at a the carrier sample radian frequency, $\theta_c$, which is carrier frequency, $F_c$, divided by the effective sample rate, $2fF_c$, $$\theta_c = 2\pi\left(\frac{f_c}{2f_c}\right) = \pi \quad (30)$$

The 4-tap FIR response (for a single I or Q channel) is then $$|h_{FIR\_IQMOD}(e^{j\pi})| = \Sigma_{k=0}^{3} |h_k| = 1 \quad (31)$$

The ZOH transfer function is $$\text{sinc}(\theta_c/2) = \frac{\sin\left(\frac{\theta_c}{2}\right)}{\frac{\theta_c}{2}} = \frac{2}{\pi} \quad (32)$$

These agree with eq(2).

Multi-Bit Waveform Encoding for Efficient SCCPA Operation

The single-bit Tx path above may be extended to multi-bit architecture which may be used for Cartesian modulation. A thermometer encoder with relative bit-order reversal between inverted outputs may be used to yield code transitions during which no capacitors are simultaneously switching from the low to high supply while others are switching from the high to low, thus consuming excess supply current as shown above. Also there is additional efficiency improvement due to overall reduction of switching for the same waveform. Finally, a comparison with SCPA Polar modulation type switching waveforms shows that one particular encoding achieves similar average dynamic current to the Polar modulation amplitude case, while the conventional thermometer encoding with inverted outputs (which is the same as would result for binary encoding) has almost 4x the average dynamic current (for a particular wide-band sequential waveform).

Figure 23:
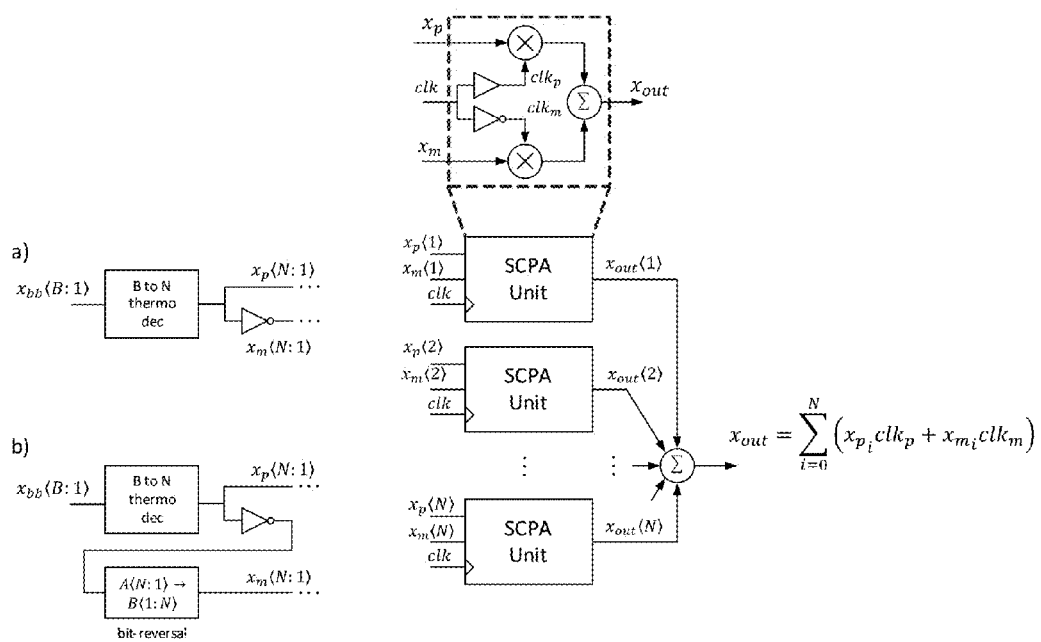
FIG. 23 shows Multi-bit SCPA having thermometer encoding with inverted outputs with relative bit-reversal of the inverted outputs.

In one example embodiment, there may be B-bits of resolution for $x_{bb}$ bit vector with B-bit to N-bit thermometer encoding followed by an inverter to get $x_p$ and $x_m$ bit vectors, respectively. Then the $x_p$ and $x_m$ vectors are applied to inputs of N-unit instances of the unipolar SCPA Tx path from FIG. 22, whose outputs are summed together. The resulting B-bit SCPA Tx path is shown in FIG. 23, which shows Multi-bit SCPA with a) thermometer encoded with inverted outputs and b) thermometer encoded with relative bit-reversal of inverted outputs.

Is has been discovered that, due to the unit element implementation, simple summation is the only algebraic operation with respect to the $x_p$ and $x_m$ inputs within the SCPA unit as well as the through the entire multi-bit path to the Tx path output. Therefore the bit-order of the $x_p$ and $x_m$ vectors does not matter. We can use any bijective one-to-one mapping. As we'll see, one which works very well is to simply reverse the bit order of the $x_m$ vector relative to the $x_p$ vector as shown in FIG. 23 at (b). It is also nice because it's just a re-mapping of signals there is no actual extra circuitry involved.

Next, is may be shown that the relative bit-order reversal results in reduction of switching and, more importantly, reducing dynamic power by reducing simultaneous switching of low to high and high low capacitors, as described above. For example, consider a 7-units thermometer encoded (8-levels) sequence. $X_{bb}$={0, 1, 7, 6, 2, 5, 4, 3, 0, ...}. Since it switches through all the possible codes, the average is one half of the maximum. Therefore, such a sequence is somewhat representative of a wide-band modulated waveform at −6 dB backoff.

Cartesian SCPA Using Conventional Thermometer Encoding with Inverted Outputs

Figure 24:
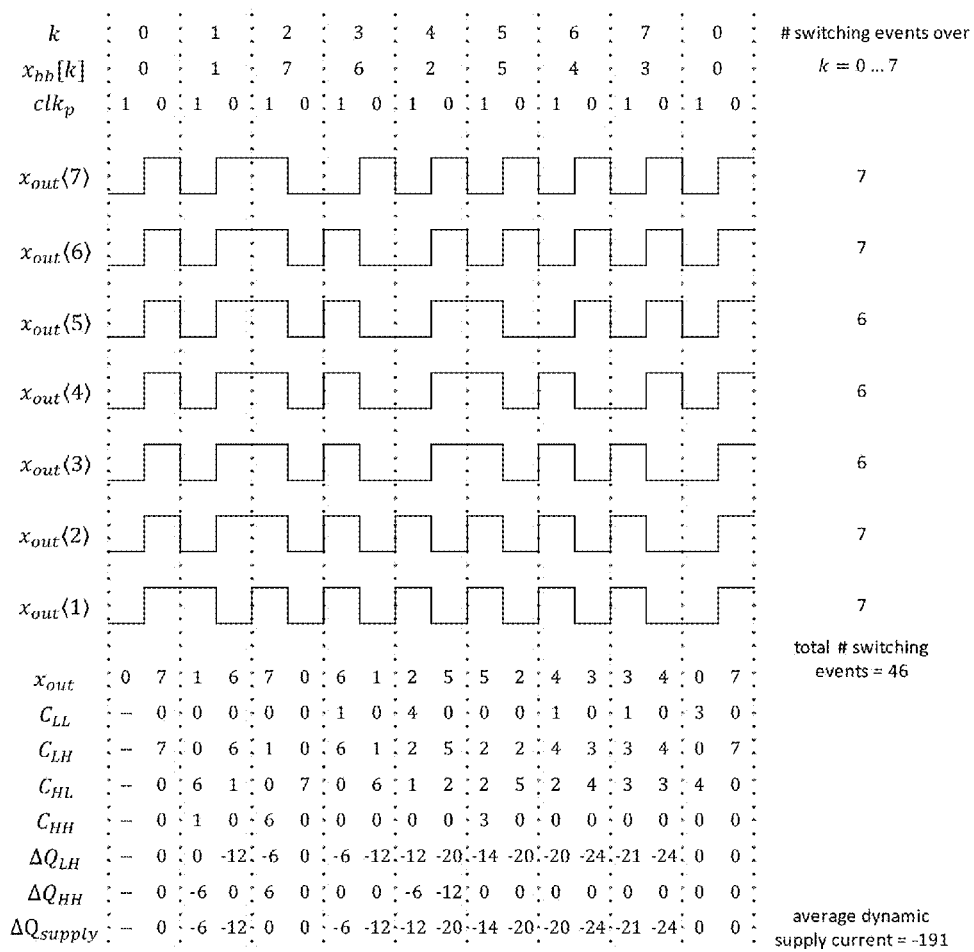
FIG. 24 shows Cartesian SCPA waveforms and dynamic supply current using conventional XNOR inverted outputs.

The switching waveforms in FIG. 24 show Cartesian SCPA waveforms and dynamic supply current using conventional XNOR inverted outputs. In this example, a baseband sequence is encoded with conventional thermometer encoding with inverted outputs.

For simplicity, the baseband signal is only chopped once per baseband symbol sample (as compared to twice, per the prescribed alternating FIR taps mentioned above). The chopping inverts the encoded waveform on the $2^{nd}$ phase of each baseband cycle. Recall, from FIG. 23 at (a) during this phase the inverted clock is selecting its inverted input, $x_m$<N: 1>, which is simply the inverted output of the thermometer encoder output, and therefore compared to the $1^{st}$ phase of the baseband cycle, unit outputs are simply toggled (inverted).

Most of the code transitions result in capacitors going from high to low ($C_{HL}$) while other are going from low to high ($C_{LH}$) which, per eq (22), draws excess charge, $Q_{LH}$, from the supply. Along with the waveforms, total capacitance in each position is shown. Then, using eq (22) and (23) the amount of charge from the supply for each code transition. $V_H$=N=7 was used in order to make the charge calculations come out as integers for easier inspection.

Figure 25:
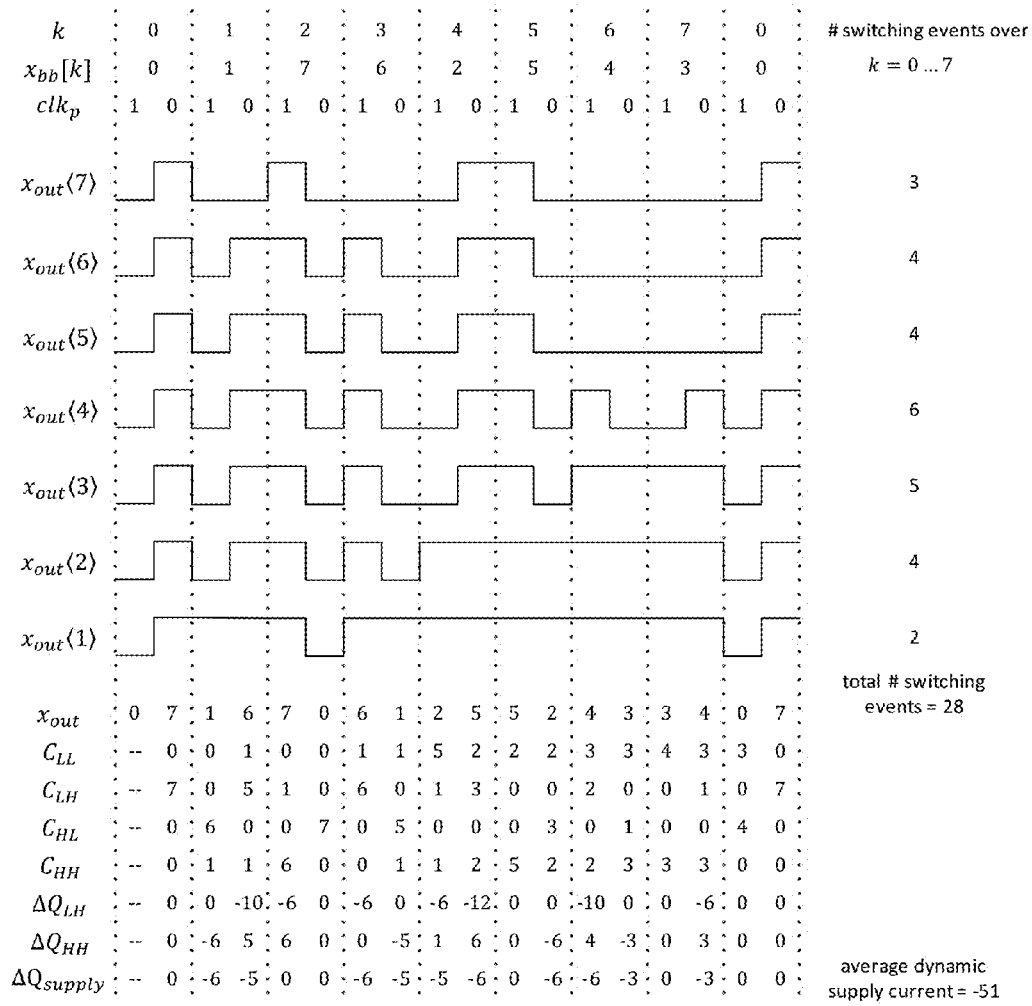
FIG. 25 shows Cartesian SCPA waveforms and dynamic supply current using proposed thermometer encoding with relative bit-order reversal between inverted outputs.

Cartesian SCPA Using Thermometer Encoding with Relative Bit-Reversal Between Inverted Outputs FIG. 25 shows Cartesian SCPA waveforms and dynamic supply current using proposed thermometer encoding with relative bit-order reversal between inverted outputs. In this example, during the second phase of each chopped baseband code, the inverted clock is selecting the bit-order reversed output of the thermometer encoder, from FIG. 23 at (b). Importantly, none of the transitions have capacitors switching high to low ($C_{HL}$) while other are going from low to high ($C_{LH}$), thus eliminating a source of excess charge from the supply, per eq (22). When toggling around the mid-codes $x_{bb}$:{3}→{4} only a single unit is toggling, which illustrates why this coding is analogous to pseudo-differential encoding and/or Class-B amplification. Advantageously, there are roughly half of the switching events compared to the conventional case.

Figure 26:
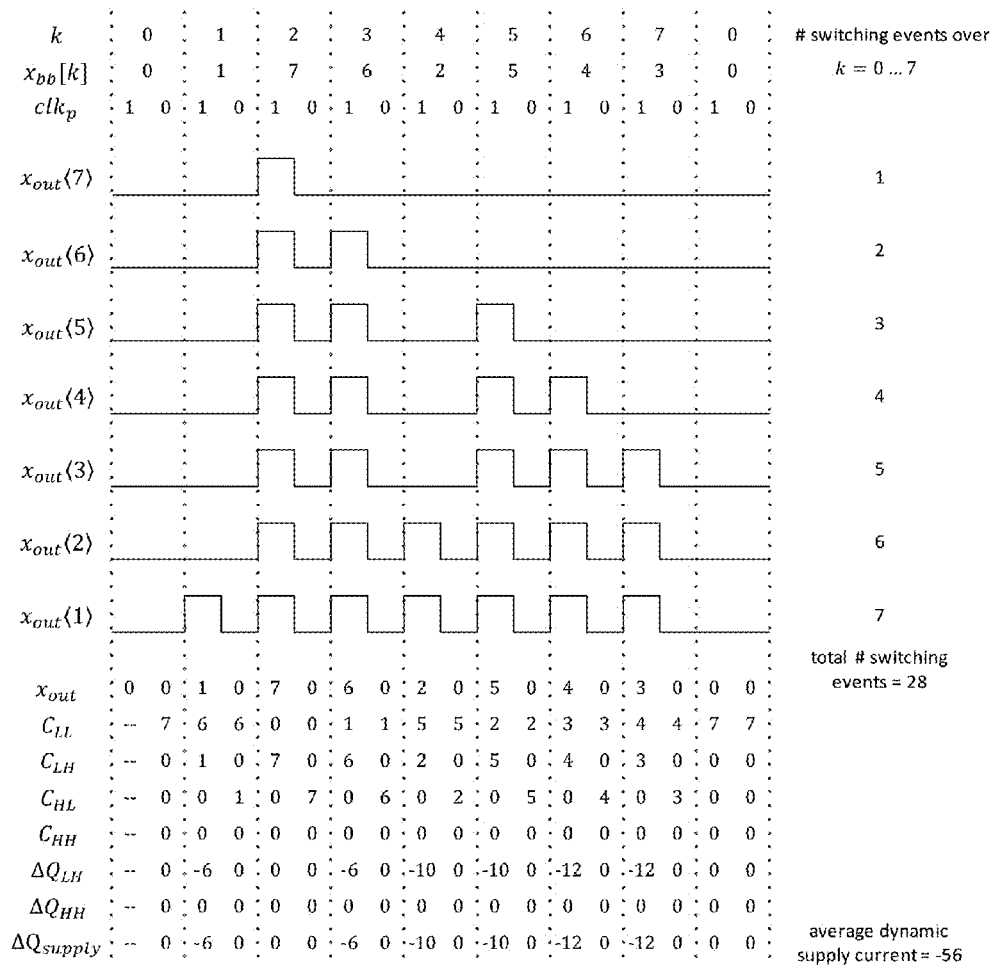
FIG. 26 shows a Polar SCPA amplitude encoded waveforms and dynamic supply current.

For comparison, in FIG. 26 shows a Polar SCPA amplitude encoded waveforms and dynamic supply current. This example has the same baseband amplitude sequence as it would be signaled through the single-ended positive output of a differential Polar modulated SCPA (of course, a Polar modulated signal generally would not have such rapid fluctuations in amplitude).

In this case, instead of being inverted, the waveform and every unit output switch back low for the $2^{nd}$ phase of the baseband cycle. For the negative output, the waveforms would be identical, but would be low for the $1^{st}$ phase and then selectively switch high on the $2^{nd}$ phase.

This waveform would also be similar to one of the pseudo-differential outputs, which being chopped (inverted) every cycle will have all the codes go to zero (as in the Polar case) almost every cycle except when the baseband waveform changes sign.

Here, we see that the switching activity and dynamic supply current are similar to the proposed Cartesian modulated SCPA with bit-order reversed thermometer encoding, shown above.

Dynamic Sinewave and Modulated Efficiencies of Direct I&Q Cartesian SCCPA

Ideal Dynamic Efficiency vs. Encoder Example Implementation

In this section we show the results from applying the four terminal switching circuit model to the Cartesian modulated SCPA in order to quantify the ideal dynamic efficiency for quadrature sinewaves and swept over the full amplitude range for three encodings including: 1) Regular differential, 2) Pseudo-differential and 3) Differential with bit-order reversed thermometer decoder outputs.

As the I and Q differential sinewaves (periodic over N samples) transition through their states i∈{0, ..., N−1}, the instantaneous output power and supply power at the $i_{th}$ sample are $$P_{out_i}=(V_{outIp_i}-V_{outIm_i})^2+(V_{outQp_i}-V_{outQm_i})^2 \quad (33)$$

and $$P_{supply_i}=P_{out_i}+P_{scIp_i}+P_{scIm_i}+P_{scQp_i}+P_{scQm_i} \quad (34)$$

in which the four capacitor switching terms are calculated from their respective (i−1)→i code transitions as $$P_{sc_i}=(\Delta Q_{LH_{i,i-1}}+\Delta Q_{HH_{i,i-1}})f_{clk}V_{DD} \quad (35)$$

where $\Delta Q_{LH}$ and $\Delta Q_{HH}$ were derived in eqs(22) and (23). Then the ideal average dynamic efficiency is calculated by averaging over the instantaneous power, as $$\eta_{ideal}(\text{average}) = \frac{\langle P_{out} \rangle}{\langle P_{supply} \rangle} \quad (36)$$

where the <•> operator denotes a time-average. This approach may also be used for Matlab simulations with actual modulated waveforms rather than sinusoids with swept amplitudes, for example.

The results shown in FIG. 6C and summarized in Table 1 (above) are plotted vs. number (each for I&Q) of combiner taps with supply voltage levels in FIG. 6C (a)-(d) set in order to normalize peak output power. FIG. 6C shows Dynamic Sinewave η_ideal of Direct I&Q Cartesian SCCPA vs. encoding: a) 1-tap, 4-volt; b) 2-tap, 2-volt; c) 4-tap, 1-volt; and d) Differential BOR, 1 to 4 taps, 1-volt.

In this example, the efficiency for pseudo-differential outperforms XNOR differential, and even better performance is for thermometer encoding with relative bit-order reversal between the inverted outputs.

In FIG. 6C at (d), the supply is set to 1 volt for all three tap-multiplier scenarios. This illustrates how to maintain higher efficiency at lower average power levels by disabling taps using average power tracking (APT).

Modulated Efficiency Results

In this section expected overall efficiencies with modulated waveforms are summarized for an example 4-tap I plus 4-tap Q SCCPA with 1.0-VDC supply.

Applications of certain embodiments may include LTE-U in UNII-3 band channel 4 (5.85 GHz) and 20 MHz Tx LTE system bandwidth and 100 RBs with QPSK, 16-QAM and 64-QAM modulation types. The I and Q baseband signals may be interpolated to an RF data sample rate of Fs=~5.85 GHz/2 and quantized to B=5 bits using baseband I and Q RF $\Delta\Sigma$Ms with noise transfer function (NTF) zeros centered in the LTE Rx bands 13 (754 MHz), and 4 (2132.4 MHz) and GPS band (1556.96 MHz).

For simplicity we used the nearest baseband-to-UNII-3-Channel-4 integer re-sampling ratio, so we have an RF Tx center frequency of 5.8368 GHz.

Figure 27:
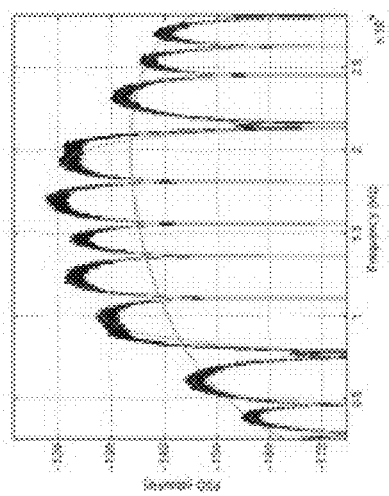
FIG. 27 is a plot of PSD spectra along with modulator linear transfer functions for an example embodiment.
Figure 27:
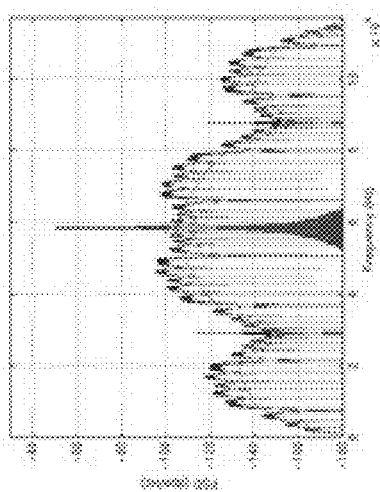
Figure 27:
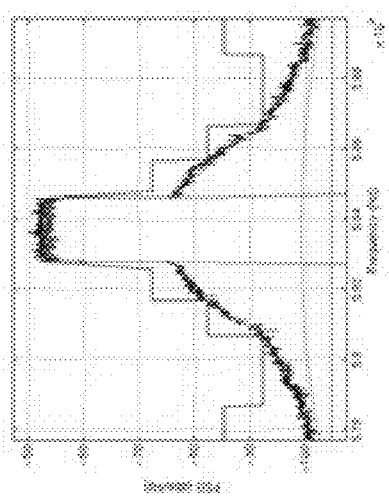

The baseband amplitude is increased to the point where distortion due to saturation in the $\Delta\Sigma$Ms begins to violate the Tx modulation spectrum power spectral density (PSD) mask limits. The PSD spectra along with the modulator linear transfer functions are plotted in FIG. 27, which shows UNII-3 band Channel ~4, Tx Modulated Spectrum 64-QAM SC-FDMA. The efficiency results are summarized in Tables 2A and 2B below. The top half of the table is for ideal lossless SCCPA, e.g. excluding losses due to combiner passive efficiency and switching logic, drivers, switches, whereas the bottom half of the table includes these losses. By increasing the supply to 1.25 VDC we can increase the average power by ~2 dB if needed to compensate post SCCPA insertion losses.

TABLE 2A

Overall Modulated Efficiencies for 20 MHz QPSK, 16-QAM and 64-QAM

| Mod Type | PAPR RFin dB | PAPR RFout dB | $\eta$ % | Pout max dBm | Pout avg dBm |
|---|---|---|---|---|---|
| QPSK | 11.0 | 5.7 | 63.5 | 23.9 | 18.0 |
| 16-QAM | 9.9 | 5.0 | 68.9 | 22.9 | 18.9 |
| 64-QAM | 10.0 | 5.9 | 63.2 | 23.6 | 18.0 |
| QPSK | 11.0 | 5.7 | 33.5 | 22.6 | 17.0 |
| 16-QAM | 9.9 | 5.0 | 35.6 | 23.9 | 17.9 |
| 64-QAM | 10.0 | 5.9 | 33.3 | 22.9 | 17.0 |

TABLE 2B

Overall Modulated Efficiencies for 20 MHz QPSK, 16-QAM and 64-QAM

| Mod Type | PSD 11 MHz dBr | PSD 20 MHz dBr | PSD 30 MHz dBr | PSD 50 MHz dBr | RxBN B13 dBm/Hz | RxBN B4 dBm/Hz | RxBN GPS dBm/Hz |
|---|---|---|---|---|---|---|---|
| QPSK | 21.7 | 28.2 | 39.8 | 45.7 | −171.7 | −174.3 | −151.5 |
| 16-QAM | 24.0 | 30.5 | 39.2 | 47.7 | −172.7 | −175.7 | −151.4 |
| 64-QAM | 23.3 | 29.1 | 39.5 | 46.0 | −172.2 | −175.3 | −151.6 |
| QPSK | 21.7 | 28.2 | 39.8 | 45.7 | −172.7 | −175.3 | −152.5 |
| 16-QAM | 24.0 | 30.5 | 39.2 | 47.7 | −173.7 | −176.7 | −152.4 |
| 64-QAM | 23.3 | 29.1 | 39.5 | 46.0 | −173.2 | −176.3 | −152.6 |

TABLE 3

True Differential vs. Pseudo-differential encoding

| Input | True Differential Encoding | | | | Pseudo-differential Encoding | | | |
|---|---|---|---|---|---|---|---|---|
| Code | $x_p$ | $x_m$ | $x_p - x_m$ | $x_p - x_m$ | $x_p$ | $x_m$ | $x_p - x_m$ | $x_p - x_m$ |
| 7 | 7 | 0 | 7 | 7 | 7 | 0 | 7 | 7 |
| 6 | 6 | 1 | 5 | 7 | 5 | 0 | 5 | 5 |
| 5 | 5 | 2 | 3 | 7 | 3 | 0 | 3 | 3 |
| 4 | 4 | 3 | 1 | 7 | 1 | 0 | 1 | 1 |
| 3 | 3 | 4 | −1 | 7 | 0 | 1 | −1 | 1 |
| 2 | 2 | 5 | −3 | 7 | 0 | 3 | −3 | 3 |
| 1 | 1 | 6 | −5 | 7 | 0 | 5 | −5 | 5 |
| 0 | 0 | 7 | −7 | 7 | 0 | 7 | −7 | 7 |

TABLE 4A

Conventional 8-level 3-bit Thermometer encoder with inverted outputs

| Input | Positive Outputs | | | | | | |
|---|---|---|---|---|---|---|---|
| Code | $x_p(7)$ | $x_p(6)$ | $x_p(5)$ | $x_p(4)$ | $x_p(3)$ | $x_p(2)$ | $x_p(1)$ |
| 7 | 1 | 1 | 1 | 1 | 1 | 1 | 1 |
| 6 | 0 | 1 | 1 | 1 | 1 | 1 | 1 |
| 5 | 0 | 0 | 1 | 1 | 1 | 1 | 1 |
| 4 | 0 | 0 | 0 | 1 | 1 | 1 | 1 |
| 3 | 0 | 0 | 0 | 0 | 1 | 1 | 1 |
| 2 | 0 | 0 | 0 | 0 | 0 | 1 | 1 |
| 1 | 0 | 0 | 0 | 0 | 0 | 0 | 1 |
| 0 | 0 | 0 | 0 | 0 | 0 | 0 | 0 |

TABLE 4B

Conventional 8-level 3-bit Thermometer encoder with inverted outputs

| Input | Negative Outputs | | | | | | |
|---|---|---|---|---|---|---|---|
| Code | $x_m(7)$ | $x_m(6)$ | $x_m(5)$ | $x_m(4)$ | $x_m(3)$ | $x_m(2)$ | $x_m(1)$ |
| 7 | 0 | 0 | 0 | 0 | 0 | 0 | 0 |
| 6 | 1 | 0 | 0 | 0 | 0 | 0 | 0 |
| 5 | 1 | 1 | 0 | 0 | 0 | 0 | 0 |
| 4 | 1 | 1 | 1 | 0 | 0 | 0 | 0 |
| 3 | 1 | 1 | 1 | 1 | 0 | 0 | 0 |
| 2 | 1 | 1 | 1 | 1 | 1 | 0 | 0 |
| 1 | 1 | 1 | 1 | 1 | 1 | 1 | 0 |
| 0 | 1 | 1 | 1 | 1 | 1 | 1 | 1 |

TABLE 5A

Thermometer encoder with relative bit-order reversal between inverted outputs

| Input | Positive Outputs | | | | | | |
|---|---|---|---|---|---|---|---|
| Code | $x_p(7)$ | $x_p(6)$ | $x_p(5)$ | $x_p(4)$ | $x_p(3)$ | $x_p(2)$ | $x_p(1)$ |
| 7 | 1 | 1 | 1 | 1 | 1 | 1 | 1 |
| 6 | 0 | 1 | 1 | 1 | 1 | 1 | 1 |
| 5 | 0 | 0 | 1 | 1 | 1 | 1 | 1 |
| 4 | 0 | 0 | 0 | 1 | 1 | 1 | 1 |
| 3 | 0 | 0 | 0 | 0 | 1 | 1 | 1 |
| 2 | 0 | 0 | 0 | 0 | 0 | 1 | 1 |
| 1 | 0 | 0 | 0 | 0 | 0 | 0 | 1 |
| 0 | 0 | 0 | 0 | 0 | 0 | 0 | 0 |

TABLE 5B

Thermometer encoder with relative bit-order reversal between inverted outputs

| Input Code | Negative Outputs | | | | | | |
|---|---|---|---|---|---|---|---|
| | $x_m(7)$ | $x_m(6)$ | $x_m(5)$ | $x_m(4)$ | $x_m(3)$ | $x_m(2)$ | $x_m(1)$ |
| 7 | 0 | 0 | 0 | 0 | 0 | 0 | 0 |
| 6 | 0 | 0 | 0 | 0 | 0 | 0 | 1 |
| 5 | 0 | 0 | 0 | 0 | 0 | 1 | 1 |
| 4 | 0 | 0 | 0 | 0 | 1 | 1 | 1 |
| 3 | 0 | 0 | 0 | 1 | 1 | 1 | 1 |
| 2 | 0 | 0 | 1 | 1 | 1 | 1 | 1 |
| 1 | 0 | 1 | 1 | 1 | 1 | 1 | 1 |
| 0 | 1 | 1 | 1 | 1 | 1 | 1 | 1 |

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A transmitter comprising:
a plurality of switched capacitor transmitter circuits each comprising a plurality of capacitors, wherein the plurality of capacitors are switchably coupled between a power supply terminal and a reference voltage terminal; and
an inductive power combiner network having a plurality of inputs coupled to a plurality of outputs of the plurality of switched capacitor transmitter circuits, wherein the inductive power combiner network is configured to combine voltages from the plurality of switched capacitor transmitter circuits to produce a combined voltage at an output of the transmitter,
wherein each of the plurality of switched capacitor transmitter circuits further comprising at least one inductor coupled between the plurality of capacitors and one of the plurality of inputs of the inductive power combiner network.

2. The transmitter of claim 1 wherein the inductive power combiner network comprises a distributed transformer.

3. The transmitter of claim 2 wherein the switched capacitor transmitter circuits comprise differential outputs, wherein a first output of each switched capacitor transmitter circuit is coupled to a first terminal of an inductive element in the distributed transformer and a second output of each switched capacitor transmitter circuit is coupled to a first terminal of a different adjacent inductive element in the distributed transformer.

4. The transmitter of claim 2 wherein the switched capacitor transmitter circuits comprise differential outputs, and wherein the differential outputs are coupled to differential inputs of a plurality of transformer components in the distributed transformer.

5. The transmitter of claim 2 wherein a first plurality of the switched capacitor transmitter circuits couple an in-phase (I) component of a digital data signal to a first plurality of inputs of the distributed transformer, and a second plurality of the switched capacitor transmitter circuits couple a quadrature (Q) component of the digital data signal to a second plurality of inputs of the distributed transformer.

6. The transmitter of claim 1 wherein a digital data signal is successively coupled through a plurality of series delay circuits to the plurality of switched capacitor transmitter circuits to filter the digital data signal.

7. A transmitter comprising:
a plurality of switched capacitor transmitter circuits each comprising a plurality of capacitors, wherein the plurality of capacitors are switchably coupled between a power supply terminal and a reference voltage terminal; and
an inductive power combiner network having a plurality of inputs coupled to a plurality of outputs of the plurality of switched capacitor transmitter circuits, wherein the inductive power combiner network is configured to combine voltages from the plurality of switched capacitor transmitter circuits to produce a combined voltage at an output of the transmitter, wherein
a first plurality of the plurality of capacitors each comprise a first terminal coupled to a first terminal of a first inductor,
a second plurality of the plurality of capacitors each comprise a first terminal coupled to a first terminal of a second inductor,
and wherein each capacitor of the plurality of capacitors is coupled to the power supply terminal for a particular switched capacitor transmitter circuit through a first switch, and each capacitor of the plurality of capacitors is coupled to the reference voltage terminal for the particular switched capacitor transmitter circuit through a second switch.

8. The transmitter of claim 7, further comprising a plurality of switching logic circuits corresponding to the plurality of capacitors, wherein the first switch and the second switch for each capacitor of the plurality of capacitors is controlled by a particular switching logic circuit of the plurality of switching logic circuits.

9. The transmitter of claim 8, further comprising at least one switched data encoder circuit to receive a digital data signal to be transmitted and produce a plurality of switch control signals coupled to the plurality of switching logic circuits to turn the switches on and off, and in accordance therewith, convert the digital data signal into an analog signal comprising said combined voltage at the output of the transmitter.

10. The transmitter of claim 8 wherein the switching logic circuits receive an encoded digital data signal and a clock signal having a frequency least two times the frequency of the encoded digital data signal, and wherein the switching logic circuits combine the encoded digital data signal and the clock signal to produce switch control signals to control said switches coupled to each capacitor.

11. The transmitter of claim 1 wherein the transmitter is a wireless transmitter, wherein the output of the transmitter is coupled to an antenna.

12. The transmitter of claim 1 wherein different switched capacitor transmitter circuits have different power supply voltages.

13. The transmitter of claim 1 wherein different switched capacitor transmitter circuits have the same power supply voltages.

14. A method comprising:
receiving a digital data signal to be transmitted in a plurality of switched capacitor transmitter circuits each comprising a plurality of capacitors, wherein the plurality of capacitors are switchably coupled between a power supply terminal and a reference voltage terminal; and combining voltages from the plurality of switched capacitor transmitter circuits in an inductive power combiner network to produce a combined voltage at an output of the transmitter, wherein each of the plurality of switched capacitor transmitter circuits further comprising at least one inductor coupled between the plurality of capacitors and one of a plurality of inputs of the inductive power combiner network.

15. The method of claim 14 wherein the inductive power combiner network comprises a distributed transformer.

16. The method of claim 14 further comprising successively coupling the digital data signal through a plurality of series delay circuits to the plurality of switched capacitor transmitter circuits to filter the digital data signal.

17. The method of claim 14 wherein the transmitter is a wireless transmitter, wherein the output of the transmitter is coupled to an antenna.

18. A transmitter comprising:

a plurality of switched capacitor transmitter means for switchably coupling a plurality of capacitors between a power supply terminal and a reference voltage; and inductive means for combining voltages from the plurality of switched capacitor transmitter means to produce a combined voltage, wherein each of the plurality of switched capacitor transmitter means further comprising at least one inductor coupled between the plurality of capacitors and one of a plurality of inputs of the inductive means, and wherein the plurality of switched capacitor transmitter means are controlled by a digital data signal to be transmitted, and wherein the plurality of switched capacitor transmitter means and the inductive means convert the digital data signal into an analog signal comprising the combined voltage at an output of the inductive means.

\* \* \* \* \*